(12) United States Patent
Suehiro et al.

(10) Patent No.: US 9,097,833 B2
(45) Date of Patent: Aug. 4, 2015

(54) LIGHT EMITTING DEVICE

(75) Inventors: Yoshinobu Suehiro, Kiyosu (JP); Koji Tasumi, Kiyosu (JP); Osamu Ito, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 612 days.

(21) Appl. No.: 13/373,095

(22) Filed: Nov. 4, 2011

(65) Prior Publication Data

US 2012/0250329 A1    Oct. 4, 2012

(30) Foreign Application Priority Data

Mar. 30, 2011    (JP) ................................. 2011-076722

(51) Int. Cl.
| | | |
|---|---|---|
| *F21V 3/00* | (2006.01) | |
| *F21V 8/00* | (2006.01) | |
| *F21V 29/76* | (2015.01) | |
| *F21Y 103/00* | (2006.01) | |

(52) U.S. Cl.
CPC .............. *G02B 6/0085* (2013.01); *F21V 29/76* (2015.01); *F21Y 2103/003* (2013.01); *G02B 6/0021* (2013.01); *G02B 6/0031* (2013.01); *G02B 6/0078* (2013.01)

(58) Field of Classification Search
CPC ........................ F21Y 2101/02; H01L 2924/00
USPC ...................... 362/311.02, 217.05; 257/98–99
See application file for complete search history.

(56) References Cited

U.S. PATENT DOCUMENTS

| | | | |
|---|---|---|---|
| 6,481,130 B1 * | 11/2002 | Wu ................................. | 40/546 |
| 7,556,404 B2 * | 7/2009 | Nawashiro et al. ........... | 362/293 |
| 2004/0211970 A1 | 10/2004 | Hayashimoto et al. | |
| 2006/0214879 A1 | 9/2006 | Sugimoto et al. | |

(Continued)

FOREIGN PATENT DOCUMENTS

| | | |
|---|---|---|
| JP | 2003-8071 A | 1/2003 |
| JP | 2004-327863 A | 11/2004 |

(Continued)

OTHER PUBLICATIONS

Japanese Office Action dated Dec. 17, 2013, with partial English translation.

(Continued)

*Primary Examiner* — Sean Gramling
(74) *Attorney, Agent, or Firm* — McGinn IP Law Group, PLLC.

(57) ABSTRACT

A light emitting device includes a light source including an inorganic material substrate, a light emitting element mounted on a mounting surface of the inorganic material substrate, and a metalized pattern formed on a non-mounting surface of the inorganic material substrate on which the light emitting element is not mounted, a mounting substrate including an mounting surface on which the light source is mounted, and a conductor pattern formed on the mounting surface and bonded to the metalized pattern, and an optical member disposed on the mounting surface of the mounting substrate so as to guide a light emitted from the light source in a predetermined direction. The optical member includes a heat absorbing surface at least a part of which faces the conductor pattern of the mounting substrate, and a heat radiating surface that radiates heat of the light source conducted from the conductor pattern via the heat absorbing surface.

19 Claims, 16 Drawing Sheets

(56) References Cited

U.S. PATENT DOCUMENTS

| | | |
|---|---|---|
| 2006/0261364 A1 | 11/2006 | Suehiro et al. |
| 2007/0064131 A1 | 3/2007 | Sawanobori et al. |
| 2008/0203417 A1 | 8/2008 | Konishi et al. |
| 2009/0078957 A1* | 3/2009 | Hoshina .......................... 257/98 |
| 2010/0123164 A1* | 5/2010 | Suehiro et al. ................. 257/99 |

FOREIGN PATENT DOCUMENTS

| | | |
|---|---|---|
| JP | 2005-77505 A | 3/2005 |
| JP | 2005-276491 A | 10/2005 |
| JP | 2006-269785 A | 10/2006 |
| JP | 2008-235867 A | 10/2008 |
| JP | 2009-021303 A | 1/2009 |
| JP | 2009-054801 A | 3/2009 |
| JP | 2009-231012 A | 10/2009 |
| JP | 2010-109119 A | 5/2010 |
| JP | 2010-258403 A | 11/2010 |
| JP | 2011-9789 A | 1/2011 |

OTHER PUBLICATIONS

Japanese Office Action dated Apr. 22, 2014, with partial English translation.

* cited by examiner

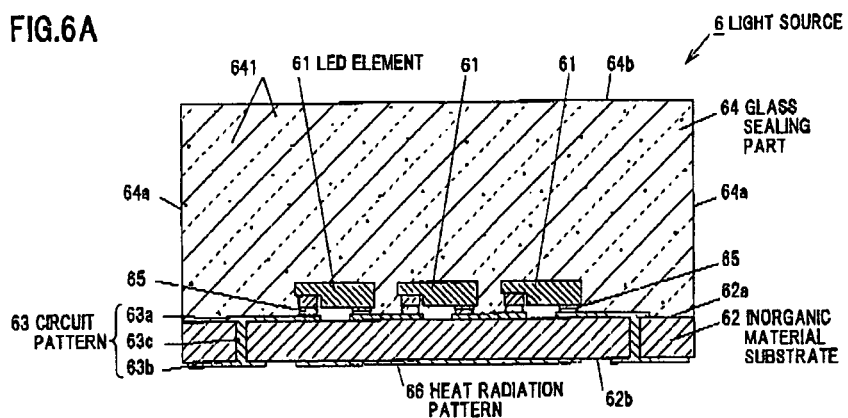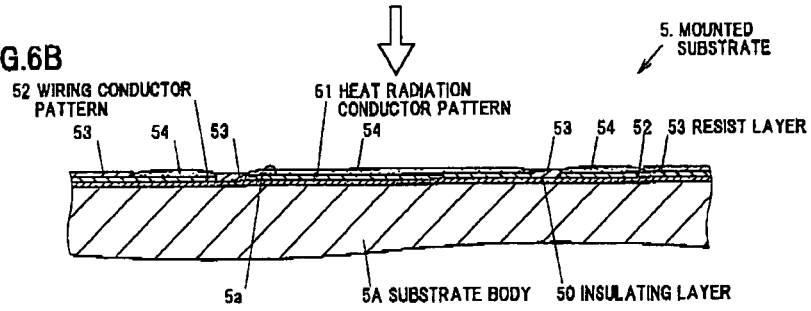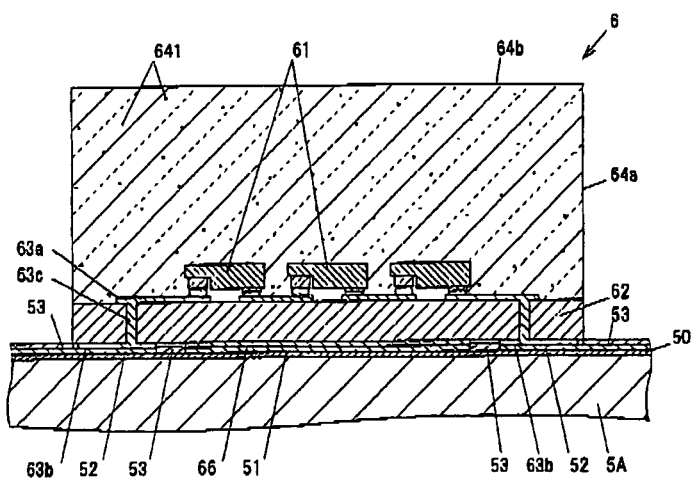

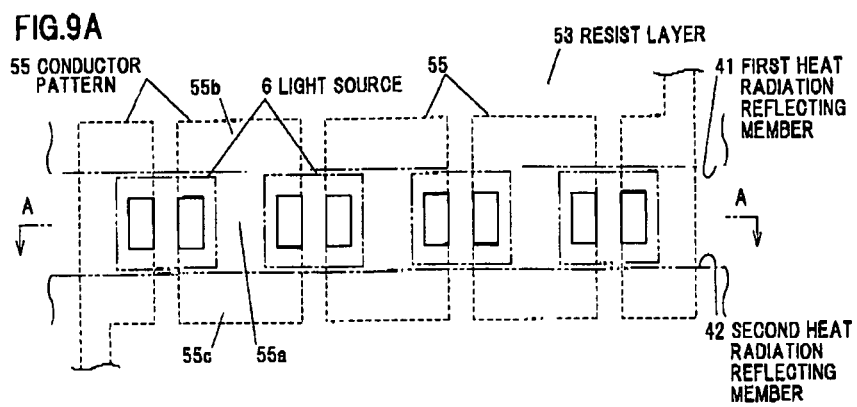
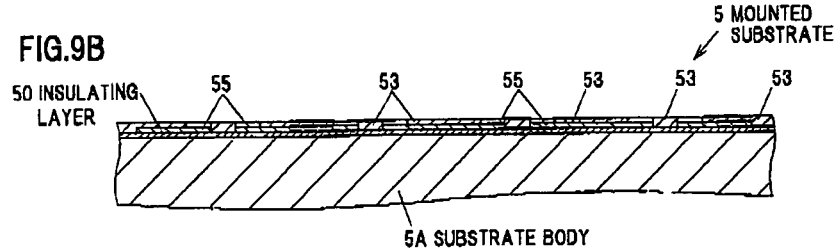

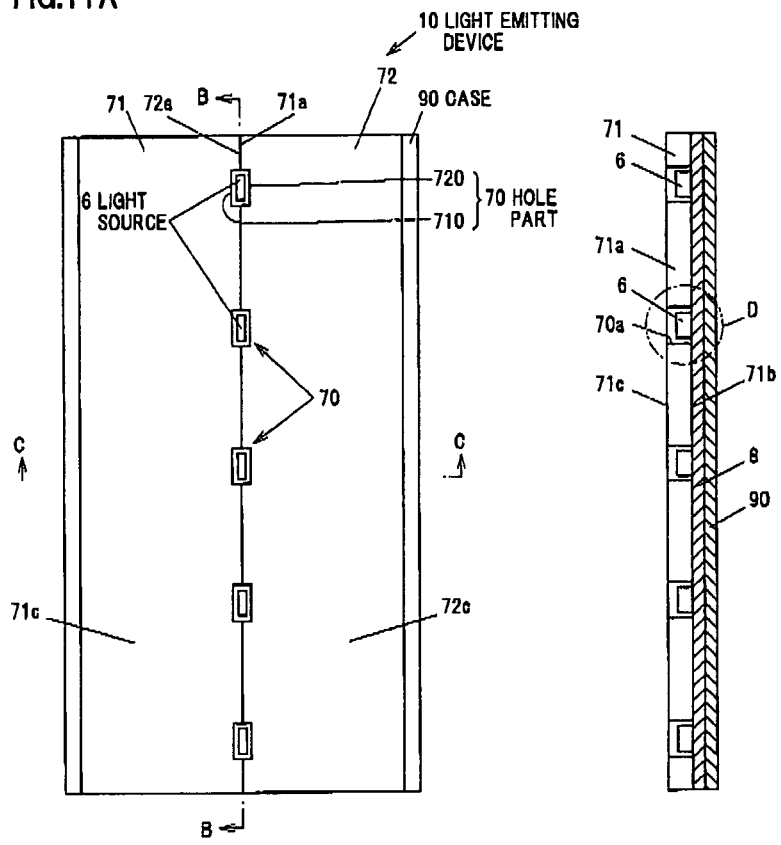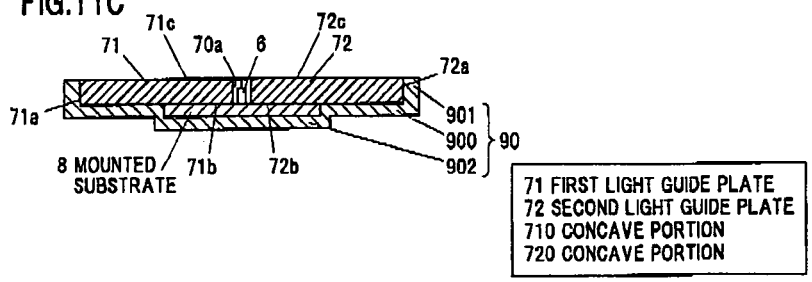

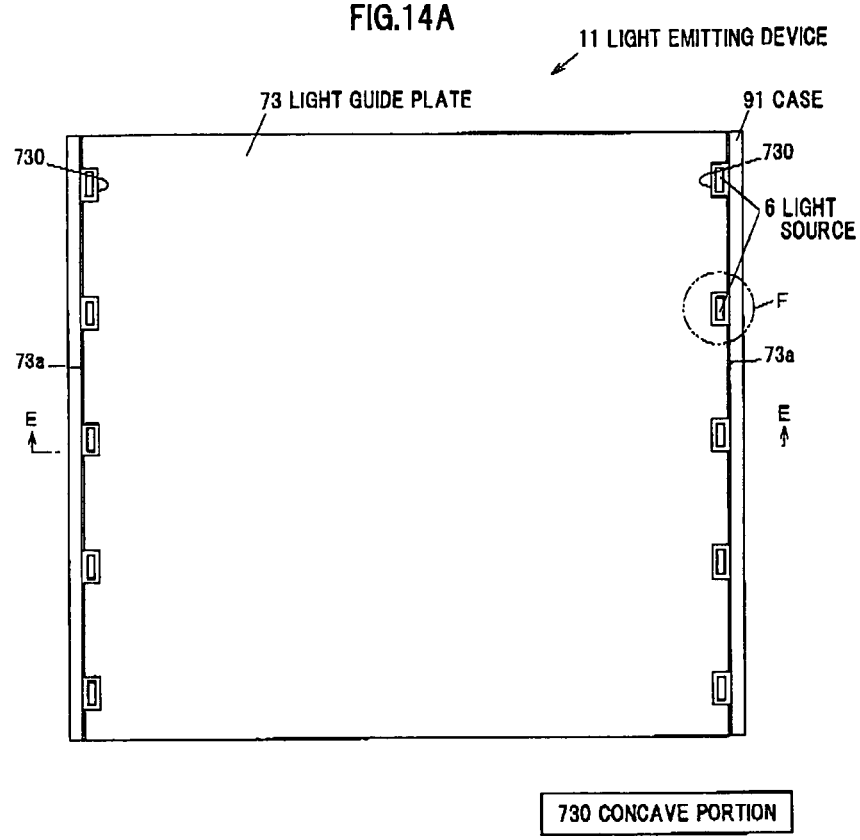
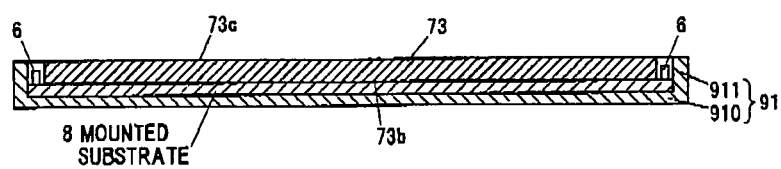

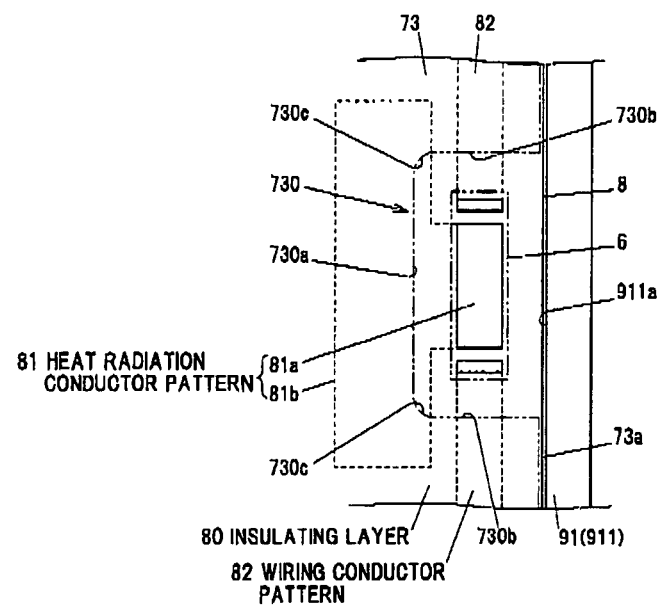

LIGHT EMITTING DEVICE

The present application is based on Japanese patent application No. 2011-076722 filed on Mar. 30, 2011, the entire contents of which are incorporated herein by reference.

BACKGROUND OF THE INVENTION

1. Field of the Invention

This invention relates to a light emitting device that guides and radiates an emission light of a light emitting element in a predetermined direction.

2. Description of the Related Art

Heretofore, a light emitting device is known, that has a plurality of light emitting diodes. In recent years, the application of the light emitting diode is enlarged, this the light emitting diode is widely used for indoor lighting, radiation of object in a scanner and the like. The above-mentioned light emitting device that needs a large amount of light includes a light emitting device to which heat radiation measures are applied for preventing thermal destruction of the light emitting diode itself due to heat generated in the light emitting diode (for example, refer to JP-2011-9789 A1).

A solid element device described in JP-2011-9789 A1 has a configuration that a heat radiation pattern is formed in a rear side of an inorganic material substrate in which a light emitting diode element is mounted in a front side, so that heat generated in the light emitting diode element is thermally-conducted from the heat radiation pattern to a heatsink or the like.

However, depending on the configuration of the light emitting device, it may be difficult to bring the heatsink into contact with the heat radiation pattern directly. In addition, in case that the inorganic material substrate is mounted on the mounting substrate in which the circuit pattern for providing electric power to the light emitting diode element is formed, it is needed to form though holes in the mounting substrate for the purpose of bringing the heat radiation pattern into contact with the heatsink, and to bring the heat radiation pattern into contact with the heatsink via the though holes. Consequently, there is a problem that the structure becomes complex and assembly man-hour is increased.

SUMMARY OF THE INVENTION

Accordingly, it is an object of the invention to provide a light emitting device that is capable of preventing the configuration from being complicated and enhancing a heat radiation performance of the light source.

(1) According to one embodiment of the invention, a light emitting device comprises:

a light source comprising an inorganic material substrate, a light emitting element mounted on a mounting surface of the inorganic material substrate, and a metalized pattern formed on a non-mounting surface of the inorganic material substrate on which the light emitting element is not mounted;

a mounting substrate comprising an mounting surface on which the light source is mounted, and a conductor pattern formed on the mounting surface and bonded to the metalized pattern; and an optical member disposed on the mounting surface of the mounting substrate so as to guide a light emitted from the light source in a predetermined direction, wherein the optical member comprises a heat absorbing surface at least a part of which faces the conductor pattern of the mounting substrate, and a heat radiating surface that radiates heat of the light source conducted from the conductor pattern via the heat absorbing surface.

In the above embodiment (1) of the invention, the following modifications and changes can be made.

(i) The metalized pattern is formed including at least a part of a region of the side of the non-mounting surface corresponding to a mounting region in the mounting surface in which the light emitting element is mounted.

(ii) The metalized pattern is formed between a pair of electrodes for providing electric power to the light emitting element formed on the inorganic material substrate and insulated from the pair of electrodes.

(iii) The conductor pattern has a width corresponding to a width of the metalized pattern in a direction of connecting the pair of electrodes and extends from a bonding part thereof to the metalized pattern to a position opposite to the heat absorbing surface of the optical member.

(iv) The metalized pattern comprises an electrode formed on the inorganic material substrate for providing electric power to the light emitting element.

(v) The optical member further comprises a reflecting surface opposite to the light source for reflecting light of the light source, (vi) The optical member further comprises a main body part formed of a metal material, and a reflecting part formed of a white resin material and formed opposite to the light source, and the reflecting surface is on a surface of the reflecting part opposite to the light source.

(vii) The optical member is formed of a translucent material and plate-shaped so as to guide light of the light source inputted through an end surface thereof to be outputted from an other surface thereof.

Effects of the Invention

According to one embodiment of the invention, a light emitting device can be provided that is capable of preventing the configuration from being complicated and enhancing a heat radiation performance of the light source.

BRIEF DESCRIPTION OF THE DRAWINGS

The preferred embodiments according to the invention will be explained below referring to the drawings, wherein:

FIG. 6A is a cross-sectional view schematically showing the light source before the light source is mounted on a mounting substrate;

FIG. 6B is a cross-sectional view schematically showing the mounting substrate before the light source is mounted on the mounting substrate;

FIG. 6C is a cross-sectional view schematically showing the light source and the mounting substrate after the light source is mounted on the mounting substrate;

FIG. 9A is a plan view schematically showing the mounting substrate according to the modification of the first embodiment;

FIG. 9B is a cross-sectional view taken along the line A-A in FIG. 9A;

FIG. 11A is a plan view schematically showing a light emitting device according to a second embodiment of the invention;

FIG. 11B is a cross-sectional view taken along the line B-B in FIG. 11A;

FIG. 11C is a cross-sectional view taken along the line C-C in FIG. 11A;

FIG. 14A is a plan view schematically showing a light emitting device according to a first modification of the second embodiment;

FIG. 14B is a cross-sectional view taken along the line E-E in FIG. 14A.

FIG. 14C is a partially enlarged plan view of "F" part shown in FIG. 14A;

DETAILED DESCRIPTION OF THE PREFERRED EMBODIMENTS

In each of the drawings, identical codes are given to constitutional elements that have a substantively identical function without adding explanations.

First Embodiment

Figure 1:
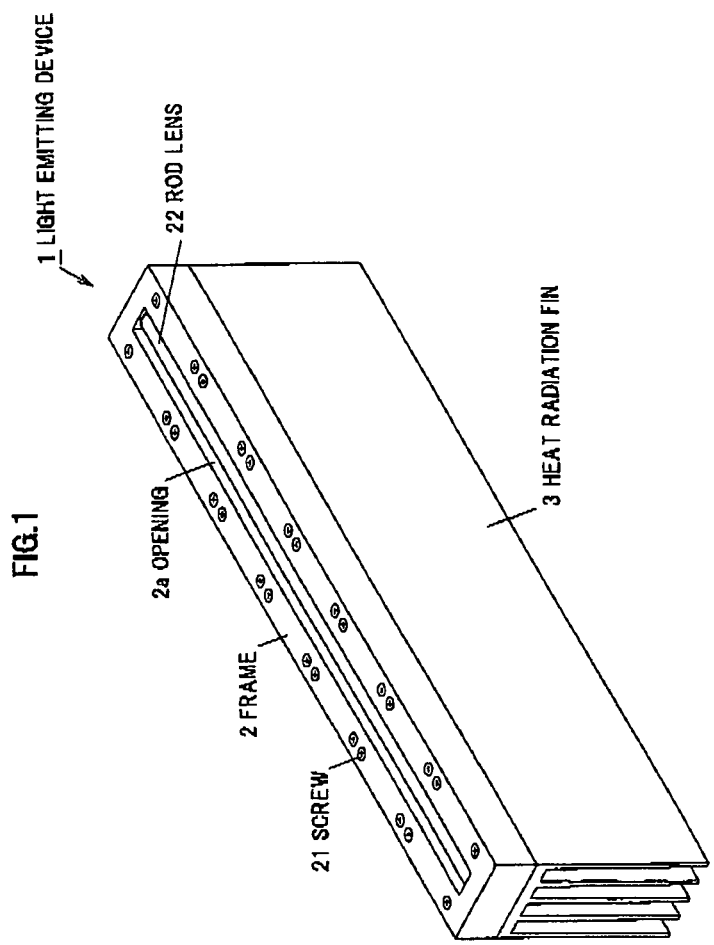
FIG. 1 is a perspective view schematically showing a light emitting device according to a first embodiment of the invention.

FIG. 1 is a perspective view schematically showing a light emitting device according to a first embodiment of the invention. A light emitting device 1 is used for, for example, lighting of an inspection device for detecting a scratch or a stain of a liquid crystal film.

The light emitting device 1 includes a frame 2 having an opening 2a of an linear shape and a heat radiation fin 3 fastened to the frame 2 by screws 21. The light emitting device 1 has almost a rectangular parallelepiped shape as a whole, and hereinafter it will be explained about a case that the frame 2 is located at upper position and the heat radiation fin 3 is located at the lower position. The opening 2a is formed on the upper surface of the frame 2 to have a linear shape, and a rod lens 22 is disposed within the opening 2a.

Figure 2:
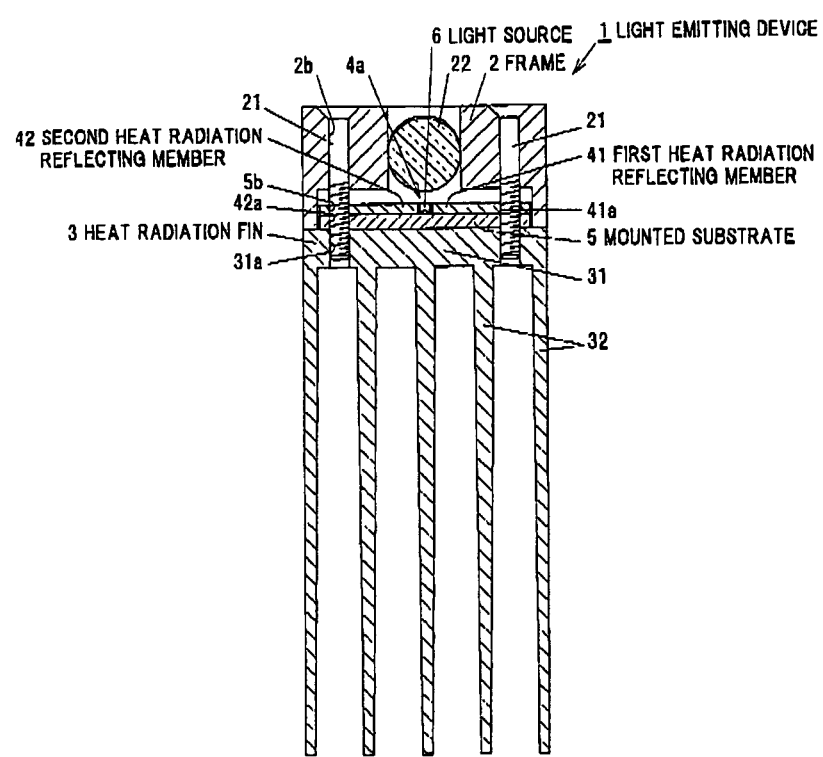
FIG. 2 is a cross-sectional view schematically showing the light emitting device according to the first embodiment of the invention.

FIG. 2 is a cross-sectional view schematically showing the light emitting device 1. Between the frame 2 and the heat radiation fin 3, the light emitting device 1 includes a mounting substrate 5 basically formed of a metal material that has a flat plate-like shape and is brought into surface-contact with the heat radiation fin 3, a first heat radiation reflecting member 41 and a second heat radiation reflecting member 42 as optical members disposed on the upper side of the mounting substrate 5, and a plurality of light sources 6 mounted on the mounting substrate 5.

The mounting substrate 5 is placed on the upper surface of the heat radiation fin 3, has screw holes 5b that is threadably mounted on the screws 21 inserted into screw holes 2b of the frame 2, and is fastened to the heat radiation fin 3 by the screws 21. In the embodiment, the mounting substrate 5 is formed of basically copper. Here, a relationship between contact area of the mounting substrate 5 and the heat radiation fin 3 and power input of a plurality of light sources 6 is configured to be not less than 100 mm$^2$/W.

The first and second heat radiation reflecting members 41, 42 are formed to have a flat plate-like shape, have screw holes 41a, 42a that are threadably mounted on the screws 21, and are fastened to the heat radiation fin 3 and the mounting substrate 5 by the screws 21. A part of the lower surfaces of the first and second heat radiation reflecting members 41, 42 is contact with the mounting substrate 5.

The first and second heat radiation reflecting members 41, 42 are disposed in parallel in such a way that edge surfaces themselves face each other across a space 4a formed therebetween. In the space 4a, a plurality of light sources 6 are disposed. In the embodiment, the height from the mounting substrate 5 of the first and second heat radiation reflecting members 41, 42 is substantively the same as that of the light source 6.

The heat radiation fin 3 integrally includes an upper part 31 having screw holes 31a that are threadably mounted on the screws 21 after the mounting substrate 5 is mounted, and a plurality of fin parts 32 extending downward from the upper part 31. Each of the fin parts 32 is formed to be separated at a predetermined distance in the across-the-width direction, and the surface area thereof is configured to be capable of radiating heat of each of the light sources 6 by heat radiation dire to air convection. In the embodiment, the heat radiation fin 3 is formed of aluminum. Further, between the mounting substrate 5 and the heat radiation fin 3, silicon grease for filling a gap therebetween is coated.

The rod lens 22 is formed of a glass having a cylindrical shape that causes less deterioration due to a light of short wavelength. The rod lens 22 is supported by the frame 2 formed of aluminum.

Figure 3:
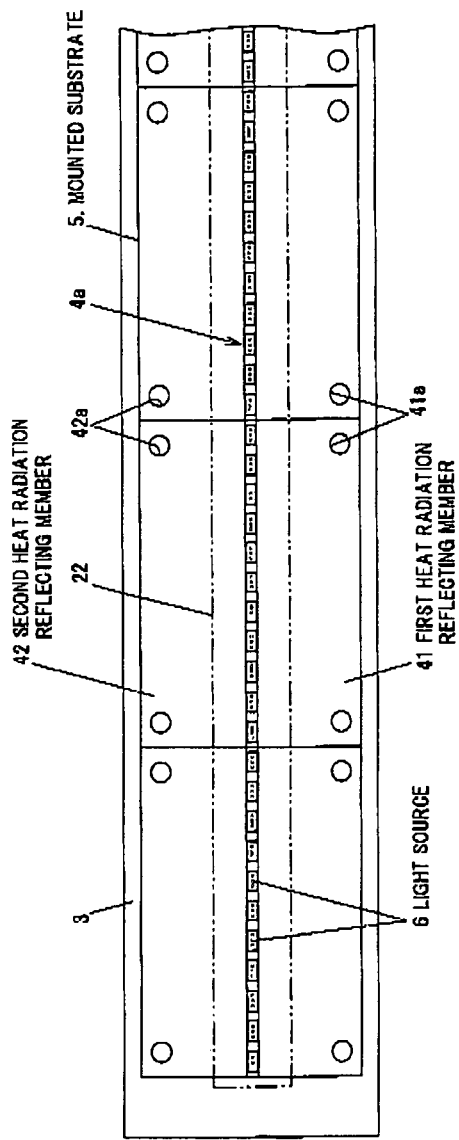
FIG. 3 is a partial plan view schematically showing the light emitting device in which a frame and a rod lens are removed.

FIG. 3 is a partial plan view schematically showing the light emitting device 1 in which the frame 2 and the rod lens 22 are removed. The light emitting device 1 includes a plurality (seven in the embodiment) of the mounting substrates 5, but FIG. 3 shows only a part of the mounting substrates 5. In addition, FIG. 3 shows an outline of the rod lens 22 at the lower side of the first heat radiation reflecting member 41 and the second heat radiation reflecting member 42 by chain double-dashed lines.

A plurality of the light sources 6 are respectively arranged in a linear shape along the longitudinal direction of the light emitting device 1 so as to be mounted in each of the mounting substrates 5. In addition, the light emitting device 1 includes the first heat radiation reflecting member 41 and the second heat radiation reflecting member 42 that are formed to correspond to each of the plural mounting substrates 5, and to be the same number as that of the mounting substrates 5 respectively.

Figure 4:
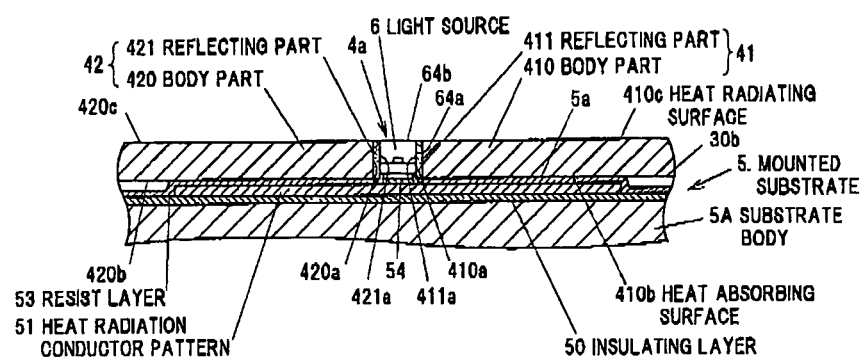
FIG. 4 is a partially enlarged cross-sectional view schematically showing a light source and a peripheral part thereof.
Figure 5:
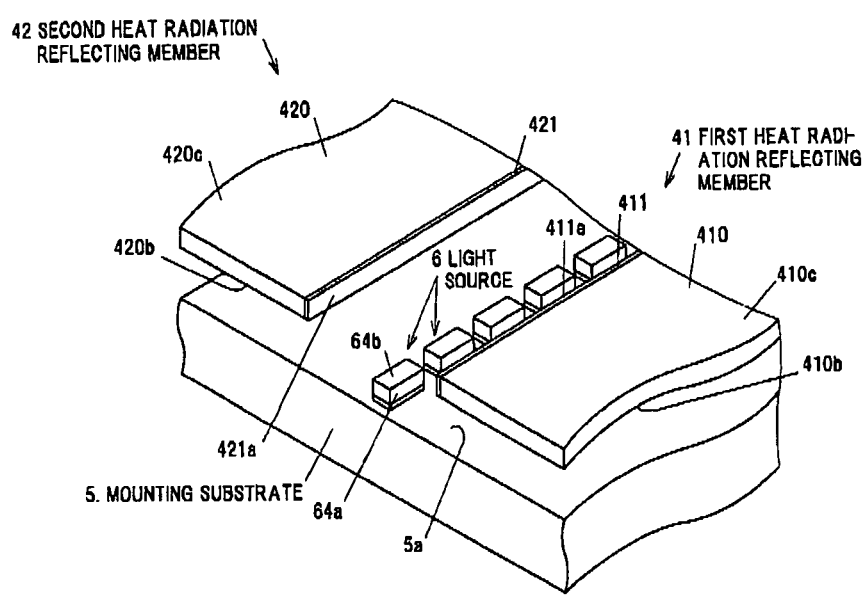
FIG. 5 is a partially exploded perspective view of the light emitting device schematically showing the light source and the peripheral part thereof.

FIG. 4 is a partially enlarged cross-sectional view schematically showing the light source 6 and a peripheral part thereof. FIG. 5 is a partially exploded perspective view of the light emitting device 1 schematically showing the light source 6 and the peripheral part thereof.

The first heat radiation reflecting member 41 includes a body part 410 of a plate-like shape formed of a metal member and a reflecting part 411 formed on an edge surface 410a of the body part 410. In the embodiment, the body part 410 is formed of aluminum and the reflecting part 411 is formed of a white acrylic resin coating material that is coated on the edge surface 410a. Further, the reflecting part 411 is not particularly limited to coating application, it can be also formed by that a reflecting member formed of a white resin is laminated, and by that the edge surface 410a of the body part 410 is mirror-finished.

In addition, the reflecting part 411 can be also formed of a fluorine based sheet having a hollow portion. In case that the reflecting part 411 is formed of the above-mentioned sheet, even if the reflecting part 411 comes into contact with the light source 6, the light source 6 causes less breaking, and it is possible to totally reflect a light of the light source 6. On the other hand, in case that the sheet having a hollow portion is used, heat conducted from the light source 6 to the reflecting part 411 via the sheet is reduced, but by the radiation effect due to a heat radiation conductor pattern 51 described below, it is possible to increase the heat conducted to the reflecting part 411. Further, the sheet is not particularly limited to the fluorine based sheet, but a sheet using an nonwoven cloth formed of the other material can be also used.

The second heat radiation reflecting member 42 includes a body part 420 and a reflecting part 421 that are formed similarly to the first heat radiation reflecting member 41, and the reflecting part 421 is formed at the side of the light source 6 of the edge surface 420a of the body part 420. The light source 6 is mounted and disposed on the mounting surface 5a of the mounting substrate 5 in such a way that the side surface 64a thereof faces a reflecting surface 411a of the reflecting part 411 of the first heat radiation reflecting member 41 and a reflecting surface 421a of the reflecting part 421 of the second heat radiation reflecting member 42.

The body part 410 of the first heat radiation reflecting member 41 is contact with the upper surface of the mounting substrate 5. The lower surface of the body part 410 is formed as a heat absorbing surface 410b having a planar shape that absorbs heat of the light source 6 mainly from the mounting substrate 5. In addition, The upper surface of the body part 410 is formed as a heat radiating surface 410c that radiates the heat absorbed from the heat absorbing surface 410b outward.

Also, similarly in the second heat radiation reflecting member 42, the lower surface of the body part 420 is formed as a heat absorbing surface 420b, and the upper surface of the body part 420 is formed as a heat radiating surface 420c that radiates the heat absorbed from the heat absorbing surface 420b outward.

In addition, a light emitted from the side surface 64a of the light source 6 is reflected by the reflecting surface 411a of the reflecting part 411 of the first heat radiation reflecting member 41 or the reflecting surface 421a of the reflecting part 421 of the second heat radiation reflecting member 42 so as to be guided into the side of the rod lens 22.

The mounting substrate 5 includes a substrate body 5A, an insulating layer 50 formed on a whole surface at the side of a mounting surface 5a of the substrate body 5A, a heat radiation conductor pattern 51 formed at the upper side of the insulating layer 50, and a resist layer 53 formed as the outermost surface of the mounting substrate 5.

The substrate body 5A is formed of, for example, a metal material that has a plate-like shape. In the embodiment, as the material of the substrate body 5A, aluminum is used, but copper can be also used. The insulating layer 50 is formed of, for example, an epoxy resin based insulating material that has a thickness of 80 to 200 μm and a heat resistance of 1 to 3 W/m·K. The heat radiation conductor pattern 51 is formed of, for example, a metal film that has a thickness of 35 to 500 μm. The heat radiation conductor pattern 51 of the embodiment is formed of a copper foil that has a thickness of 200 μm. The resist layer 53 is formed of, for example, a white epoxy resin based insulating material that has a thickness of 80 to 200 μm and a heat resistance of 1 to 3 W/m·K.

FIG. 6A is a cross-sectional view schematically showing the light source 6 before the light source 6 is mounted on the mounting substrate 5, FIG. 6B is a cross-sectional view schematically showing the mounting substrate 5 before the light source 6 is mounted on the mounting substrate 5 and FIG. 6C is a cross-sectional view schematically showing the light source 6 and the mounting substrate 5 after the light source 6 is mounted on the mounting substrate 5.

The light source 6 includes an inorganic material substrate 62 that is formed of an inorganic material such as ceramics, LED elements 61 as a plurality of light emitting elements that is flip-mounted at the side of the mounting surface 62a of the inorganic material substrate 62, a circuit pattern 63 that is formed in the inorganic material substrate 62 so as to provide electric power to each of the LED elements 61, a glass sealing part 64 that seals each of the LED elements 61 on the inorganic material substrate 62, a bump that intervenes between each of the LED elements 61 and the circuit pattern 63, and a heat radiation pattern 66 that is formed of a metal film formed on a non-mounting surface 62b (a rear surface) being an opposite side of the mounting surface 62a of the inorganic material substrate 62. The heat radiation pattern 66 is an example of the metalized pattern used in the invention.

The LED element 61 is formed of, for example, a semiconductor represented by a formula of $In_xAl_yGa_{1-x-y}N$ (here, $0 \leq x \leq 1$, $0 \leq y \leq 1$, $0 \leq x+y \leq 1$), and emits a blue light. The LED element 61 is formed to have a thickness of 100 μm and a shape of a square of 346 μm on a side. In addition, the LED element 61 is arranged in such a way that the light emitting layer thereof is parallel to the inorganic material substrate 62. The light source 6 does not include an optical member for facing the light emitted from the LED element 61 in a specific direction, thus the light is radiated in a 360 degrees radius of a planar direction parallel to the inorganic material substrate 62. Further, the semiconductor used for the LED element 61 is not particularly limited, for example, the other semiconductor material such as an AlGaAs based material, a GaAsP based material can be also used.

In the embodiment, the three LED elements 61 are arranged in a row to the one light source 6, and the light source 6 is formed to have a rectangular parallelepiped shape elongated in the arrangement direction of the LED element 61. The LED element 61 has a dimension of 2.8 mm in the arrangement direction, 0.75 mm in the perpendicular direction to the arrangement direction, and 0.85 mm in the height (in a center axis direction of the light source 6).

The inorganic material substrate 62 according to the embodiment is formed of aluminum nitride (AlN) that is a kind of ceramics, and has a dimension of 2.8 mm×0.75 mm and a thickness of 0.25 mm. In addition, the inorganic material substrate 62 can be also formed of a polycrystalline sintered material of alumina ($Al_2O_3$). Further, the inorganic material substrate 62 can be also formed of ceramics other than AlN or a semiconductor material such as silicon.

The circuit pattern 63 includes an upper surface pattern 63*a* that is formed on the mounting surface 62*a* of the inorganic material substrate 62 so as to electrically connected to each of the LED elements 61, an electrode pattern 63*b* that is formed on the non-mounting surface 62*b* of the inorganic material substrate 62 so as to electrically connected to a wiring conductor pattern 52 described below of the mounting substrate 5, and a via pattern 63*c* that passes through the inorganic material substrate 62 in the thickness direction so as to electrically connect the upper surface pattern 63*a* and the electrode pattern 63*b* to each other. In the embodiment, the three LED elements 61 are connected to each other in series by the upper surface pattern 63*a*, and electric power is provided from the electrode patterns 63*b* formed in two places of the non-mounting surface 62*b*.

In addition, between the electrode patterns 63*b* formed in two places of the non-mounting surface 62*b* of the inorganic material substrate 62, the heat radiation pattern 66 is formed. The heat radiation pattern 66 is formed to cover a whole range corresponding to a rear side of a region of the mounting surface 62*a* in which the three LED elements 61 are mounted.

The upper surface pattern 63*a*, the electrode patterns 63*b* and the heat radiation pattern 66 are formed of, for example, a metal film that is formed by applying a metallization process to the inorganic material substrate 62. In the embodiment, the upper surface pattern 63*a*, the electrode patterns 63*b* and the heat radiation pattern 66 are formed of a copper foil.

The glass sealing part 64 is formed of a $ZnO-B_2O_3-SiO_2$ based heat sealing glass and is formed on the inorganic material substrate 62. The glass sealing part 64 seals the LED elements 61 on the inorganic material substrate 62 so as to form the four side surfaces 64*a* perpendicular to the bottom surface bonded to the inorganic material substrate 62. In the embodiment, a glass of $ZnO-B_2O_3-SiO_2-Nb_2O_5-Na_2O-Li_2O$ is used, and the heat sealing glass has a glass transition temperature (Tg) of 490 degrees C., a deformation point (At) of 520 degrees C., a coefficient of thermal expansion ($a$) at 100 to 300 degrees C. of $6 \times 10^{-6}$/degree C. and a refraction index of 1.7. Further, the composition of the glass is not particularly limited to this, for example, the heat sealing glass can also have a composition that $Li_2O$ is not included and it can also include $ZrO_2$, $TiO_2$ and the like as an optional ingredient. Needless to say, a glass other than the $ZnO-B_2O_3-SiO_2$ based glass can be also used.

In addition, a phosphor 641 is dispersed in the glass sealing part 64. As the phosphor 641, for example, an Yttrium Aluminum Garnet (YAG) phosphor, a silicate phosphor, a mixture that the YAG phosphor and the silicate phosphor are mixed in a predetermined ratio or the like can be used. The LED element 61 having a blue color is combined together, thereby a white light can be obtained. Further, it can be also adopted to obtain the white light by combining an LED element emitting a ultraviolet light with a blue phosphor, a green phosphor and a red phosphor. In addition, the phosphor 641 can be also formed by being coated on the upper surface 64*b* of the glass sealing part 64 instead of being dispersed in the glass sealing part 64. Furthermore, a configuration in which the phosphor 641 is not included can be also adopted.

When the light source 6 is formed, first the inorganic material substrate 62 of a flat plate-like shape on which the LED elements 61 are mounted and a glass of a plate-like shape softened by heating so as to be the glass sealing part 64 are bonded to each other by a hot press process. And then, the inorganic material substrate 62 and the glass are divided in a grid-like shape by a dicing device, thereby the light source 6 of a rectangular parallelepiped shape of which two side surfaces 64*a* are parallel to each other is formed.

The wiring conductor pattern 52 is a conductor for providing electric current for light emission to the LED elements 61 of the light source 6, and it has the same thickness and is formed of the same material as the heat radiation conductor pattern 51. The resist layer 53 is formed at the upper side of the heat radiation conductor pattern 51, and in a part except for a boding part of the wiring conductor pattern 52 to the electrode pattern 63*b* of the light source 6.

A creamy solder 54 is coated on the boding part of the wiring conductor pattern 52 to the electrode pattern 63*b* and the surface of the heat radiation conductor pattern 51, and is heated and cooled after the light source 6 is mounted, thereby the wiring conductor pattern 52 and the electrode pattern 63*b*, and the heat radiation conductor pattern 51 and the heat radiation pattern 66 are respectively bonded (soldered) to each other. Further, the boding of the wiring conductor pattern 52 to the electrode pattern 63*b* is not particularly limited to the soldering, it can be also carried out by using an electrically-conducting adhesive or an Au—Sn based eutectic type brazing filler metal. In addition, a direct bonding based on metal atom diffusion by ultrasonic sound wave can be also used.

Figure 7A:
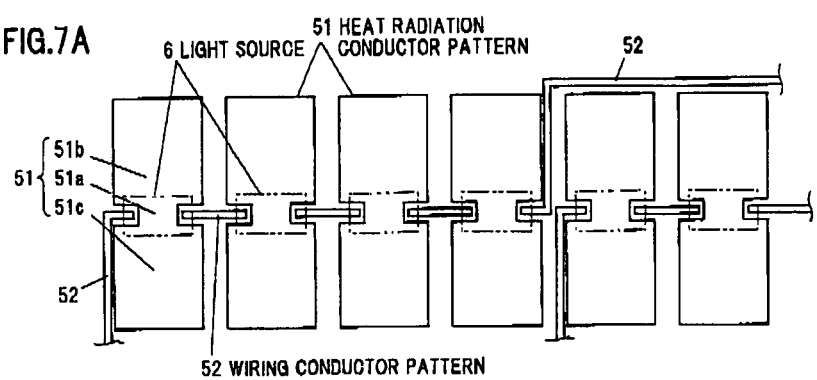
FIG. 7A is a plan view schematically showing shapes of a heat radiation conductor pattern and a wiring conductor pattern of the mounting substrate.

FIG. 7A is a plan view schematically showing the shapes of the heat radiation conductor pattern 51 and the wiring conductor pattern 52 that are formed at the side of the mounting surface 5*a* of the mounting substrate 5. In the drawing, an outer edge of mounting region on which the light source 6 is mounted (an outline of the light source 6) is shown by chain double-dashed lines.

The wiring conductor pattern 52 allows the four light sources 6 arranged along the longitudinal direction of the light source 6 to connect in series to each other so as to provide electric power to the light sources 6. The wiring conductor pattern 52 is formed to be arranged along the arrangement direction of the light source 6.

The heat radiation conductor pattern 51 includes a region between the two wiring conductor patterns 52 neighboring to each other in the arrangement direction of the light source 6, and is formed to be expanded in such a way that it extends from the region in both directions perpendicular to the arrangement direction of the light source 6. In the embodiment, the heat radiation conductor pattern 51 is electrically insulated from the wiring conductor pattern 52.

The heat radiation conductor pattern 51 includes a central part 51*a* that is formed between the two wiring conductor patterns 52, a first extending part 51*b* that extends from the central part 51*a* in one direction perpendicular to the arrangement direction of the light source 6, and a second extending part 51*c* that extends from the central part 51*a* in another direction perpendicular to the arrangement direction of the light source 6. Each of the first extending part 51*b* and the second extending part 51c has an area not less than twice the area of the heat radiation pattern 66. In the embodiment, the one heat radiation conductor pattern 51 that is independent from each other is formed to each of the light sources 6, but among the first extending parts 51b of each of the heat radiation conductor patterns 51, they can be mutually in series and integrally formed, and among the second extending parts 51c, they can be mutually in series and integrally formed similarly to the first extending parts 51b.

Further, in case that the light source 6 has a small scale but has a large heat generation, increase in temperature due to the influence of heat resistance of the insulating layer is remarkably enlarged. For example, if the heat conductivity of the insulating layer is 1 W/m·K, the thickness is 100 μm, the area of the heat radiation conductor pattern is 2 mm², and the light source is 1 W, the increase in temperature in the insulating layer becomes 50 degrees C. In contrast to this, if the area of the heat radiation conductor pattern is doubled, quintupled and decupled, the increase in temperature in the insulating layer can be inversely reduced to 25, 10 and 5 degrees C. respectively. In particular, in case of an LED light source that uses a ceramic substrate, the ceramic is chemically stable, thus it has a feature that constituting members are not deteriorated even if large electric power is provided. On the other hand, the constituting member is more expensive than a member that a metal lead is held with a resin material, thus it is generally carried out to reduce the cost by downsizing. If a ratio of the size of the light source (the area of the mounting surface) to the provided electric power is not more than 10 mm²/W, an apparent result of increase in temperature is caused due to the influence of heat resistance of the insulating layer, if a countermeasure like the invention is not implemented.

Figure 7B:
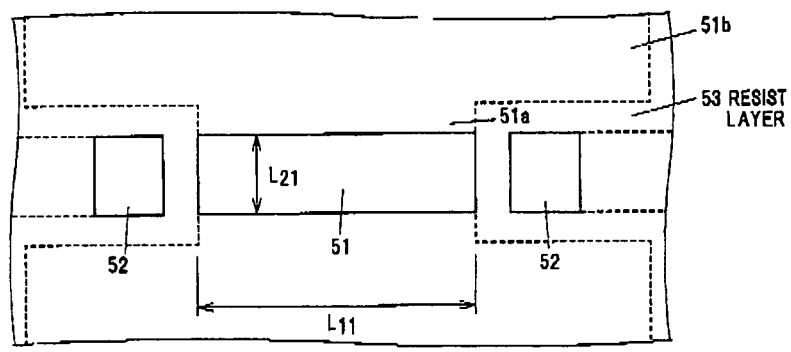
FIG. 7B is a partially enlarged plan view schematically showing a part of the mounting substrate in which the light source is mounted.
Figure 7C:
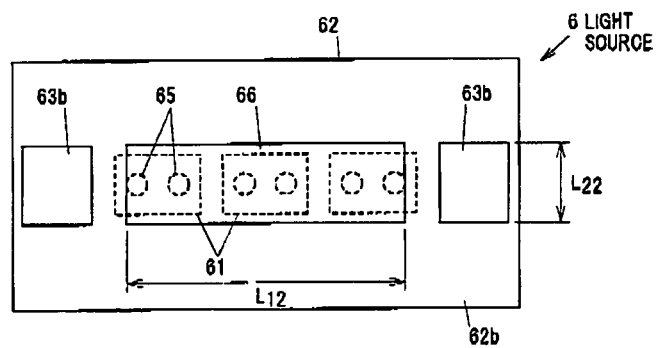
FIG. 7C is a plan view schematically showing the light source viewed from the side of a non-mounting surface of an inorganic material substrate.

FIG. 7B is a partially enlarged plan view schematically showing a part of the mounting substrate 5 in which the light source 6 is mounted. FIG. 7C is a plan view schematically showing the light source 6 viewed from the side of the non-mounting surface 62b of the inorganic material substrate 62.

FIG. 7B shows a part of the heat radiation conductor pattern 51 and the wiring conductor pattern 52 covered with the resist layer 53 by broken lines, and shows a boundary of a part exposed from the resist layer 53 by solid lines. As shown in the drawing, the resist layer 53 is formed on the upper surface of the mounting substrate 5 except for a part to which the electrode pattern 63b of the light source 6 and the heat radiation pattern 66 are bonded by soldering. The heat radiation conductor pattern 51 has a width along the longitudinal direction of the light source 6 (along the transverse direction in FIG. 7B) that is the narrowest at the central part 51a, and is wider at the first extending part 51b and the second extending part 51c than the central part 51a.

A width ($L_{11}$) of the central part 51a of the heat radiation conductor pattern 51 along the longitudinal direction of the light source 6 is a width corresponding to a width ($L_{12}$) of the heat radiation pattern 66 of the light source 6 along the same direction, and in the embodiment, the width ($L_{11}$) and the width ($L_{12}$) are set to the same value. Further, the width ($L_{11}$) can be larger than the width ($L_{12}$).

In addition, a width ($L_{21}$) of the exposure part of the heat radiation conductor pattern 51 that are not covered with the resist layer 53 along the widthwise direction of the light source 6 is a width corresponding to a width ($L_{22}$) of the heat radiation pattern 66 of the light source 6 along the same direction, and in the embodiment, the width ($L_{21}$) and the width ($L_{22}$) are set to the same value. Further, the width ($L_{21}$) can be larger than the width ($L_{22}$), for example, in such a way that the width ($L_{21}$) is configured to be the same width as that of the inorganic material substrate 62 of the light source 6 for the purpose of preventing a position shift from being caused by difference in level due to the thickness of the resist layer 53 when the solder is melted.

FIG. 7C shows outlines of the LED element 61 and the bump 65 viewed from the lower surface of the light source 6 by broken lines. As shown in the drawing, the heat radiation pattern 66 is formed so as to include at least a part of regions at the side of the non-mounting surface 62b corresponding to the mounting regions of the three the LED elements 61 that are mounted on the mounting surface 62a of the inorganic material substrate 62. In the embodiment, the light source 6 is configured to have a structure that all the regions corresponding to the mounting regions of the LED elements 61, namely all the regions in which the bumps 65 of the LED elements 61 exist in case of seeing through the inorganic material substrate 62 from the side of the non-mounting surface 62b, are included in the heat radiation pattern 66.

The first extending part 51b of the heat radiation conductor pattern 51 faces the heat absorbing surface 410b (refer to FIG. 4) of the first heat radiation reflecting member 41 via resist layer 53. In addition, the second extending part 51c of the heat radiation conductor pattern 51 faces the heat absorbing surface 420b (refer to FIG. 4) of the second heat radiation reflecting member 42 via resist layer 53. Furthermore, the heat absorbing surface 410b of the first heat radiation reflecting member 41 is contact with the resist layer 53 in a region at the upper side of the first extending part 51b, and the heat absorbing surface 420b of the second heat radiation reflecting member 42 is contact with the resist layer 53 in a region at the upper side of the second extending part 51c.

When electric power is provided to the light source 6 by the wiring conductor pattern 52, each of the LED elements 61 of the light source 6 emits a light, and simultaneously generates a heat. The heat is conducted to the heat radiation pattern 66 of the inorganic material substrate 62, and is conducted from the heat radiation pattern 66 to the central part 51a of the heat radiation conductor pattern 51, and is conducted to the first extending part 51b and the second extending part 51c. A part of the heat conducted to the first extending part 51b and the second extending part 51c is absorbed by the first heat radiation reflecting member 41 and the second heat radiation reflecting member 42 via the resist layer 53.

The first heat radiation reflecting member 41 and the second heat radiation reflecting member 42 radiate the absorbed heat from the heat radiating surfaces 410c, 420c (refer to FIG. 4). Due to the above-mentioned configuration, the heat of the light source 6 is diffused and radiated. Further, the other part of the heat conducted to the first extending part 51b and the second extending part 51c is radiated outward via the mounting substrate 5 and the heat radiation fin 3, but the heat radiation from the heat radiating surfaces 410c, 420c of the first heat radiation reflecting member 41 and the second heat radiation reflecting member 42 plays a role in complementing the heat radiation carried out via the heat radiation fin 3.

Effects of the First Embodiment

According to the first embodiment explained above, while it has a configuration for preventing the structure from being complicated such as through holes being formed in the mounting substrate 5, it has a configuration that the heat radiation conductor pattern of the mounting substrate 5 is formed to have an area of not less than several times or ten times the heat radiation pattern of the light source 6, thereby heat generated by power distribution to the light source 6 is diffused from the heat radiation pattern 66 to a wide area through the heat radiation conductor pattern 51. In addition, the heat is diffused in the wide area, thus it is possible to reduce the influence of heat resistance of the insulating layer 50 and the resist layer 53 to several times less or ten times less, and to conduct the heat to the substrate body 5A of the mounting substrate 5 formed of a metal and the first and second heat radiation reflecting members 41, 42. Further, the heat radiation conductor pattern 51 is broadened to a region in which the first and second heat radiation reflecting members 41, 42 are formed, thus the heat is conducted to the first and second heat radiation reflecting members 41, 42 due to heat conduction via the resist layer 53, so as to be radiated from the heat radiating surfaces 410c, 420c. Here, the heat radiation conductor pattern 51 has a function that the central part 51a thereof located at the lower side of the light source 6 receives the heat of the light source 6 via the heat radiation pattern 66, so as to allow the heat to conduct to the first extending part 51b and the second extending part 51c extending to the outside of the mounting range of the light source 6.

In addition, the first and second heat radiation reflecting members 41, 42 reflect the light of the light source 6 at the reflecting surfaces 411a, 421a so as to guide it in a predetermined direction (in the direction of the rod lens 22 in the embodiment).

Generally, a light guiding member for guiding a light of a light source is needed to be enlarged with distance from the light source due to diffusion of the light, thus in terms of downsizing of the light emitting device, it is preferable that the light guiding member is located as close to the light source as possible. In addition, if a heat radiating member for radiating heat is located away from the light source, the radiation effect is lowered, thus it is preferable that the heat radiating member is located as close to the light source as possible. However, in case that the light guiding member and the heat radiating member are formed independently and separately from each other, for the purpose of preventing interference due to the light guiding member and the heat radiating member, for example, preventing the light of the light source from being blocked by the light guiding member, restriction on disposition location of both members may be caused.

The light emitting device 1 according to the embodiment has a configuration that the first and second heat radiation reflecting members 41, 42 include the body parts 410, 420 of a plate-like shape and the reflecting parts 411, 421 so as to have both functions of light guiding and heat radiation, thus it is possible to form the reflecting surfaces 411a, 421a adjacent to the light source 6, and simultaneously to dispose the body parts 410, 420 adjacent to the light source 6.

In addition, the heat conduction from the light source 6 to the first and second heat radiation reflecting members 41, 42 is carried out by the heat radiation conductor pattern 51 that integrally includes the central part 51a facing the light source 6 and the first extending part 51b and the second extending part 51c facing the first and second heat radiation reflecting members 41, 42. Consequently, it is possible to allow the heat of the light source 6 to conduct to the substrate body 5A via the insulating layer 50, and additionally it is possible to carry out the heat conduction more effectively in comparison with a case of allowing the heat to conduct from the substrate body 5A to the first and second heat radiation reflecting members 41, 42 via the insulating layer 50. Furthermore, it is possible to prevent the light emitting device 1 from being grown in size.

Modifications of the First Embodiment

The above-mentioned first embodiment can be modified as described below. Namely, the light emitting device 1 according to the first embodiment has a configuration that the light source 6 includes the heat radiation pattern 66 insulated from the electrode pattern 63b so as to transfer the heat of the light source 6 from the heat radiation pattern 66 to the heat radiation conductor pattern 51, but the light emitting device 1 can also have a configuration that the electrode pattern 63b is formed to have a larger area than an area needed for providing electric current to the LED elements 61 so as to allow the heat of the light source 6 to conduct from the conductor pattern bonded to the electrode pattern 63b to the first and second heat radiation reflecting members 41, 42.

Hereinafter, a modification of the first embodiment will be explained referring to FIG. 8 and FIG. 9. Identical codes are given to constitutional elements of the light emitting device 1 that have a substantively the same function as the first embodiment without adding explanations.

Figure 8A:
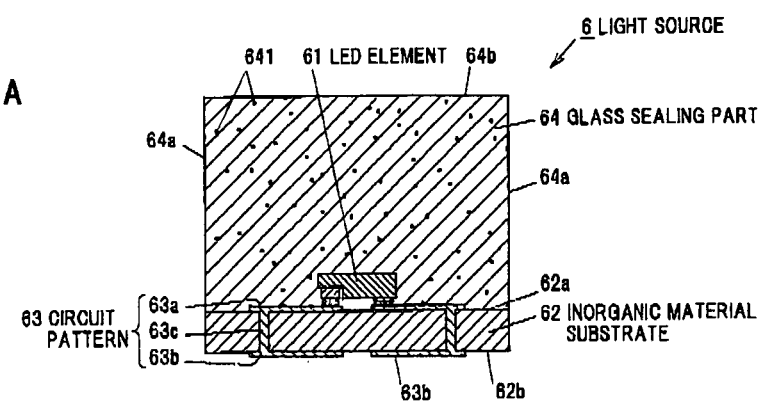
FIG. 8A is a cross-sectional view in a cross-section perpendicular to the inorganic material substrate schematically showing the light source according to a modification of the first embodiment.
Figure 8B:
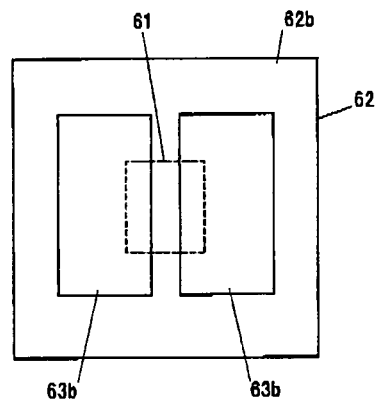
FIG. 8B is a plan view schematically showing the light source according to the modification of the first embodiment viewed from the side of the non-mounting surface of the inorganic material substrate.

FIG. 8A is a cross-sectional view in a cross-section perpendicular to the inorganic material substrate 62 schematically showing the light source 6 according to a modification of the first embodiment, and FIG. 8B is a plan view schematically showing the light source 6 according to the modification of the first embodiment viewed from the side of the non-mounting surface 62b of the inorganic material substrate 62. FIG. 8B shows an outline of the LED element 61 viewed from the lower surface of the light source 6 by broken lines.

As shown in FIG. 8A, the light source 6 according to the modification includes a single LED element 61 sealed with the glass sealing part 64. Electric power is provided to the LED element 61 by a pair of circuit patterns 63 that includes upper surface patterns 63a, electrode patterns 63b and via patterns 63c. The circuit pattern 63 is formed to an anode and a cathode of the LED element 61 respectively.

As shown in FIG. 8B, each of the two electrode patterns 63b formed on the non-mounting surface 62b of the inorganic material substrate 62 is formed to include a part of a region at the side of the non-mounting surface 62b corresponding to the mounting region of the LED element 61.

FIG. 9A is a plan view schematically showing the conductor pattern 55 and the resist layer 53 formed on the mounting surface 5a (refer to FIG. 4 and FIG. 5) of the mounting substrate 5 according to the modification of the first embodiment, and FIG. 9B is a cross-sectional view taken along the line A-A in FIG. 9A. FIG. 9A shows a part of the conductor pattern 55 that is covered with resist layer 53 by broken lines, and shows a boundary of a part of the conductor pattern 55 that is exposed from the resist layer 53 by solid lines. In addition, FIG. 9A shows an outline of the light source 6 in case that the light source 6 is mounted on the mounting substrate 5, and outlines of the first and second heat radiation reflecting members 41, 42 in case that they are disposed on the mounting substrate 5 by chain double-dashed lines. Further, the first and second heat radiation reflecting members 41, 42 has the same shape and configuration as the first embodiment.

As shown in FIG. 9A, the conductor pattern 55 has a configuration that parts to be bonded to the electrode pattern 63b of the light source 6 are exposed from the resist layer 53. A plurality of the conductor patterns 55 are formed on the mounting substrate 5, and each of the conductor patterns 55 allows a plurality (four in the embodiment) of light sources 6 to connect to each other in series.

The conductor patterns 55 integrally includes a power distribution part 55a in which electric current flows at the power distribution to the light source 6, and extending parts 55b, 55c extending from the power distribution part 55a to a region corresponding to the lower side of the first and second heat radiation reflecting members 41, 42.

The power distribution part 55*a* of the conductor patterns 55 has the substantively same width along the arrangement direction (along the horizontal direction in FIG. 9) of the plural light sources 6 as the extending parts 55*b*, 55*c*, and has a rectangular shape of which long side extends in a direction perpendicular to the arrangement direction of the light sources 6.

When power distribution is applied to the light emitting device 1 according to the modification, electric current that flows in the power distribution part 55*a* of the conductor patterns 55 is provided to each of the light sources 6, the light sources 6 emit a light, and simultaneously heat is generated. A part of the heat conducts from the electrode patterns 63*b* of the inorganic material substrate 62 (refer to FIG. 8A and FIG. 8B) to the power distribution part 55*a* of the conductor patterns 55, and conducts to the power distribution part 55*a* to the extending parts 55*b*, 55*c*, and conducts to the first and second heat radiation reflecting members 41, 42 so as to be radiated.

Figure 10A:
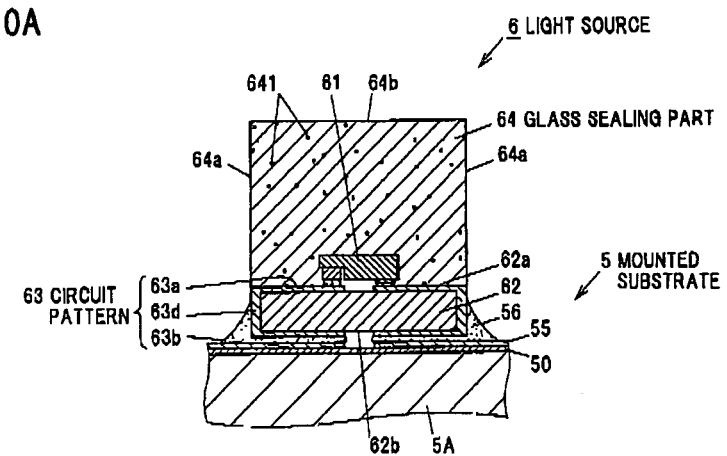
FIG. 10A is a cross-sectional view schematically showing the light source according to the modification of the first embodiment.
Figure 10B:
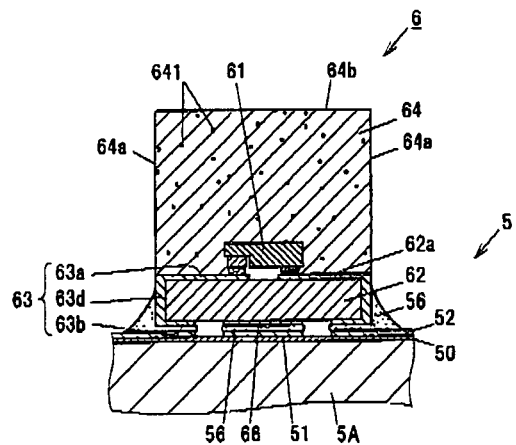
FIG. 10B is a cross-sectional view schematically showing the light source according to the modification of the first embodiment.

As shown in FIG. 10A and FIG. 10B, it is possible to further modify the light source 6. A modification shown in FIG. 10A has a configuration that the circuit pattern 63 does not have the via pattern 63*c*, and the upper surface pattern 63*a* and the electrode pattern 63*b* are connected to each other by the side surface pattern 63*d* formed on the side surface of the inorganic material substrate 62.

In case that the light source 6 is configured as described above, the solder 56 that allows the circuit pattern 63 and the wiring conductor pattern 52 to be bonded to each other is fused to the electrode pattern 63*b* and the side surface pattern 63*d*, thus a heat conduction efficiency from the circuit pattern 63 to the wiring conductor pattern 52 is enhanced so that diffusion of heat via the wiring conductor pattern 52 is accelerated. In addition, the side surface pattern 63*d* is soldered, thus by a self-arrangement effect due to surface tension of the solder 56 melted, it is possible to prevent the light source 6 from being bonded to the exposed portion of the wiring conductor pattern 52 in a state that the position is shifted.

A modification shown in FIG. 10B has a configuration that is different from the configuration shown in FIG. 10A in that the light source 6 further includes the heat radiation pattern 66, and the heat radiation pattern 66 is bonded to the heat radiation conductor pattern 51. In addition, the side surface pattern 63*d* is bonded to the wiring conductor pattern 52.

Also, in case that the light source 6 is configured as described above, the side surface pattern 63*d* is soldered to the wiring conductor pattern 52, thus by a self-arrangement effect due to surface tension of the solder 56 melted, it is possible to prevent the light source 6 from being bonded to the exposed portion of the wiring conductor pattern 52 and the heat radiation conductor pattern 51 in a state that the position is shifted. In addition, a configuration that the circuit pattern 63*a* mounting the LED elements 61 is designed so as to be widely expanded on the upper surface 62*a* of the inorganic material substrate 62 can be also adopted.

Furthermore, in the first embodiment, a case that the light emitting device 1 includes the rod lens 22 (refer to FIG. 1 and FIG. 2) having a cylindrical shape has been explained, but it is also possible to use a light guiding plate formed of a translucent resin material and plate-shaped instead of the rod lens 22. In this case, the light emitting device can be configured to have a structure that a light emitted from the side surface 64*a* of the light source 6 is reflected by the first and second heat radiation reflecting members 41, 42 so as to be guided to a light incidence plane of the light guiding plate.

Second Embodiment

Next, a second embodiment of the invention will be explained referring to FIGS. 11 to 13.

In the first embodiment and the modification thereof, a case that a radiation and reflection member is adopted, the member being configured so as to guide a light of the light source 6 in a predetermined direction due to the reflection by the reflecting surface and to carry out radiation, has been explained, but in the light emitting device 1 according to the embodiment, a light guiding plate as an optical member is used, the light guiding plate allowing a light of the light source 6 to enter into a translucent material, guiding the incident light in a predetermined direction by an internal reflection, and simultaneously carrying out radiation. The light emitting device is used for, for example, a lighting device with which a backlight of a liquid crystal display device or a fluorescent bulb is replaced.

FIG. 11A is a plan view schematically showing a light emitting device according to a second embodiment of the invention, FIG. 11B is a cross-sectional view taken along the line B-B in FIG. 11A and FIG. 11C is a cross-sectional view taken along the line C-C in FIG. 11A.

The light emitting device 10 includes a pair of first and second light guiding plates 71, 72 of which edge surfaces butt each other, a plurality of hole parts 70 that are formed by combining the first and second light guiding plates 71, 72 along the longitudinal direction, a plurality of light sources 6 that are housed in the hole parts 70 so as to be arranged in a linear shape, a mounting substrate 8 on which the plural light sources 6 are mounted, for providing electric power to the light sources 6, and a case 90 in which the first and second light guiding plates 71, 72, the plural light sources 6 and the mounting substrate 8 are housed. Further, in the explanation below, the side of a radiating surface of the first and second light guiding plates 71, 72 may be referred to as "upper side" and the side of a bottom surface of the case 90 in which the mounting substrate 8 is housed may be referred to as "lower side".

The first and second light guiding plates 71, 72 has a structure that the edge surface of the respective light guiding plates 71, 72 butt each other in a region along the arrangement direction of the plural light sources 6. In addition, the first and second light guiding plates 71, 72 are formed of a translucent material and flat plate-shaped with a constant thickness over all.

In the first light guiding plate 71, a plurality (five in the embodiment) of concave portions 710 are formed at equal intervals on the edge surface 71*a* butting the second light guiding plate 72. On the other hand, in the second light guiding plate 72, concave portions 720 of the same number as that of the concave portions 710 are formed at equal intervals on the edge surface 72*a* butting the first light guiding plate 71. The concave portions 710, 720 are formed at a location corresponding to the light sources 6 in the extension direction of the edge surfaces 71*a*, 72*a*. In addition, the concave portions 710, 720 pass through the first and second light guiding plates 71, 72 in the thickness direction thereof.

As shown in FIG. 11B and FIG. 11C, the mounting substrate 8 has a width narrower than a width obtained by combining a width of the first light guiding plate 71 and a width of the second light guiding plate 72, has a length corresponding to a length along a longitudinal direction of the first and second light guiding plates 71, 72, and is formed so as to block one side of each of the holes 70.

The case 90 is formed of, for example, a metal such as aluminum or a synthetic resin. In the embodiment, as a material of the case 90, aluminum is used in consideration of radiation performance. In addition, the case 90 includes a bottom part 900 and a side wall part 901 formed to extend in a direction perpendicular to the bottom part 900. In a central part of the bottom part 900 in the width direction, a concave portion 902 in which the mounting substrate 8 is housed is formed.

The first and second light guiding plates 71, 72 share a common configuration and function with the exception that the location and direction of the concave portions 710, 720 are bilaterally symmetric. The first and second light guiding plates 71, 72 are formed of a translucent material to a light emitted from the light source 6, for example, acrylic resin.

As shown in FIGS. 11B, 11C, the first and second light guiding plates 71, 72 have a configuration that the surfaces at the side of the bottom surface 900 of the case 90 are formed as heat absorbing surfaces 71b, 72b that face the mounting substrate 8 so as to absorb the heat of the light source 6, and the surfaces opposite to the heat absorbing surfaces 71b, 72b are formed as light radiating surfaces 71c, 72c that radiate outward the light of the light source 6 entered from the inner surface of the hole parts 70. In the embodiment, the light radiating surfaces 71c, 72c are also used as heat radiating surfaces that radiate outward the heat conducted from the heat absorbing surfaces 71b, 72b. Further, reflecting surfaces for equalizing distribution of the light radiated from the light radiating surfaces 71c, 72c can be formed in the heat absorbing surfaces 71b, 72b.

Figure 12:
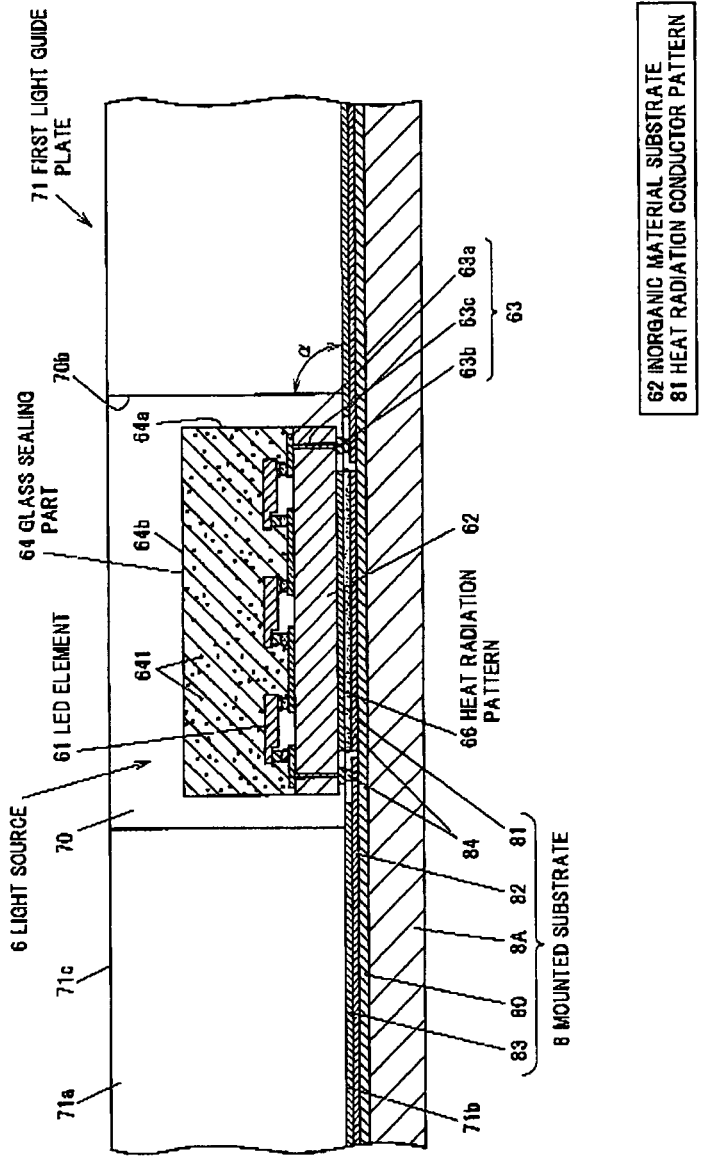
FIG. 12 is an enlarged cross-sectional view of "D" part shown in FIG. 11B.

FIG. 12 is an enlarged cross-sectional view of "D" part shown in FIG. 11B. The light source 6 has a rectangular parallelepiped shape that a length in a direction along the edge surfaces 71a, 72b of the first and second light guiding plates 71, 72 is longer than a length in a direction perpendicular to the edge surfaces 71a, 72b. The light source 6 has a configuration similar to the light source in the explanation of the first embodiment referring to FIG. 6, thus identical codes are given to constitutional elements that have a substantively identical function without adding explanations.

Further, on the upper surface 64b of the light source 6, a reflecting member that reflects a whole or a part of an emission light of the LED element 61 in a direction exited from the upper surface 64b can be also formed. As the reflecting member, for example, an acrylic board white-coated, or a material of which surface has a relatively high reflectance such as a reflecting seal formed of aluminum can be adopted. The reflecting member makes it possible to prevent the user from feeling a dazzle.

The mounting substrate 8 includes a substrate body 8A formed of a metal, an insulating layer 80 formed on the substrate body 8A, a heat radiation conductor pattern 81 and a wiring conductor pattern 82 formed on the insulating layer 80, and a white resist layer 83 formed in a region except for a region corresponding to the lower side of the light source 6. As a material of the substrate body 8A, for example, a metal such as aluminum, magnesium, copper can be used. In the embodiment, as the material of the substrate body 8A, aluminum is used.

The light source 6 is mounted on the mounting substrate 8 via a solder 84. In particular, the light source 6 has a configuration that an electrode pattern 63b thereof is bonded to the wiring conductor pattern 82 by the solder 84, and the heat radiation pattern 66 thereof is bonded to the heat radiation conductor pattern 81 by the solder 84.

In addition, as shown in FIG. 12, when an angle of inner surface of the hole part 70 to the heat absorbing surfaces 71b, 72b of the first and second light guiding plates 71, 72 is represented as "α" (degrees), and refraction index of the first and second light guiding plates 71, 72 is represented as "n", if the formula (1) described below is satisfied, all the light that enter into the first and second light guiding plates 71, 72 from the inner surface of the hole part 70, of the lights that travel in a direction of the thickness of the first and second light guiding plates 71, 72 become propagation lights in the first and second light guiding plates 71, 72. In the embodiment, "α" is equal to 90 degrees, and "n" is equal to 1,5, thus the formula (1) is satisfied.

$$90-\sin^{-1}[\{\sin(90-\alpha)\}/n]+\alpha \geq \sin^{-1}(1/n) \qquad (1)$$

In addition, if the formula (2) described below is satisfied, all the light that enter into the first and second light guiding plates 71, 72 from the inner surface of the hole part 70, of the lights that travel along the inner surface of the hole part 70 of the first and second light guiding plates 71, 72, become propagation lights in the first and second light guiding plates 71, 72. In the embodiment, "α" is equal to 90 degrees, and "n" is equal to 1, 5, thus the formula (2) is satisfied.

$$\alpha \leq 90-2\times\sin^{-1}[\sin\{(90-\alpha)/n\}] \qquad (2)$$

Figure 13:
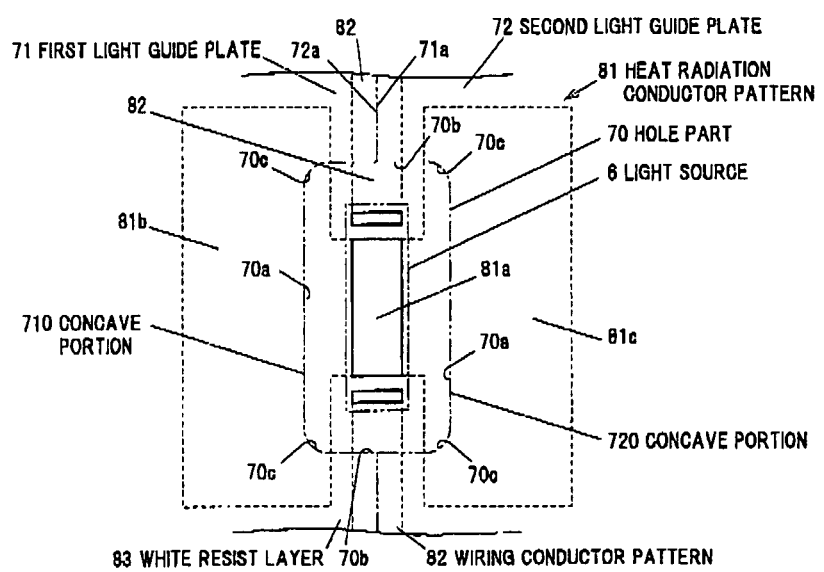
FIG. 13 is a plan view schematically showing shapes of a heat radiation conductor pattern and a wiring conductor pattern formed on an insulating layer of the mounting substrate.

FIG. 13 is a plan view schematically showing shapes of the heat radiation conductor pattern 81 and the wiring conductor pattern 82 formed on the insulating layer 80 of the mounting substrate 8. The drawing shows parts of the heat radiation conductor pattern 81 and the wiring conductor pattern 82 that are covered with the white resist layer 83 by broken lines, and shows outlines of the light source 6, the first light guiding plate 71 and the second light guiding plate 72 that are located at the upper side of the mounting substrate 8 by chain double-dashed lines.

The heat radiation conductor pattern 81 includes a central part 81a including a region exposed from the white resist layer 83 so as to be bonded to the heat radiation pattern 66 (refer to FIG. 12) of the light source 6, and first and second extending parts 81b, 81c formed at the both sides of the central part 81a so as to extend in a direction perpendicular to the longitudinal direction of the light source 6.

The two electrode patterns 63b (refer to FIG. 12) of the light source 6 are formed in both of the edge parts in the longitudinal direction of the light source 6, and the two electrode patterns 63b are respectively bonded to the white resist layers 82, 82. The heat radiation pattern 66 of the light source 6 is formed between the two electrode patterns 63b, has a rectangular shape of which long side extends in the longitudinal direction of the light source 6, and is bonded to the central part 81a of the heat radiation conductor pattern 81.

The central part 81a of the heat radiation conductor pattern 81 has a width corresponding to a width in the longitudinal direction of the heat radiation pattern 66, and is formed to reach the first extending part 81b and the second extending part 81c from the bonding part to the heat radiation pattern 66. In the embodiment, the width of the heat radiation pattern 66 in the longitudinal direction is substantively equal to the width of the central part 81a, but the width of the central part 81a can be wider that the width of the heat radiation pattern 66 in the longitudinal direction.

The first and second extending parts 81b, 81c have a rectangular shape of which long side extends in the longitudinal direction, and sandwich a part in which the light source 6 is mounted so as to be formed line-symmetrically with respect to the part. A part of the first extending part 81b faces the heat absorbing surface 71b of the first light guiding plate 71 via the white resist layer 83b. In addition, a part of the second extending part 81c faces the heat absorbing surface 72b of the second light guiding plate 72 via the white resist layer 83b. The heat absorbing surfaces 71b, 72b of the first and second light guiding plates 71, 72 are contact with the surface of the white resist layer 83b in the upper side of the first and second extending parts 81b, 81c.

The inner surface of the hole part 70 is composed of a pair of bottom surfaces 70a, 70a that are parallel to the edge surfaces 71a, 72a and face to each other, a pair of side surfaces 70b, 70b that are formed in a direction perpendicular to the edge surfaces 71a, 72a and face to each other, and four are surfaces that are formed between the bottom surfaces 70a and the side surfaces 70b respectively. The inner surface of the hole part 70 is an incidence surface from which the light of the light source 6 enters into the inside of the first and second light guiding plates 71, 72.

Effects of the Second Embodiment

According to the second embodiment explained above, while it has a configuration for preventing the structure from being complicated such as through holes being formed in the mounting substrate 8, it has a configuration that the heat radiation conductor pattern 81 of the mounting substrate 8 is formed to have an area of not less than several times or ten times the heat radiation pattern 66 of the light source 6, and the heat radiation conductor pattern 81 is brought into surface-contact with the substrate body 8A, and first and second light guiding plates 71, 72 via the insulating layer 80 and the white resist layer 83, thereby heat generated by power distribution to the light source 6 is diffused from the heat radiation pattern 66 to a wide area through the heat radiation conductor pattern 81 of the mounting substrate 8. In addition, the heat is diffused in the wide area, thus it is possible to reduce the influence of heat resistance of the insulating layer 80 and the white resist layer 83 to several times less or ten times less, and to conduct the heat to the substrate body 8A of the mounting substrate 8 formed of a metal and the first and second light guiding plates 71, 72. Further, the heat radiation conductor pattern 81 is broadened to a region in which the first and second light guiding plates 71, 72 are formed, thus the heat is conducted to the first and second light guiding plates 71, 72 due to heat conduction via the white resist layer 83, so as to be radiated from the light radiating surfaces 71c, 72c of the first and second light guiding plates 71, 72. Here, the heat radiation conductor pattern 81 has a function that the central part 81a thereof located at the lower side of the light source 6 receives the heat of the light source 6 via the heat radiation pattern 66, so as to allow the heat to conduct to the first extending part 81b and the second extending part 81c extending to the outside of the mounting range of the light source 6.

In addition, the first and second light guiding plates 71, 72 allow the light of the light source 6 to enter therein from the inner surface of the hole part 70, guide the light through the first and second light guiding plates 71, 72 in a direction perpendicular to the edge surfaces 71a, 72a, and radiate the light from the light radiating surfaces 71c, 72c.

Namely, the first and second light guiding plates 71, 72 guide the point-like shaped light of the light source 6 in a predetermined direction and diffuse the light so as to form a planar light, and simultaneously the mounting substrate 8 widely diffuses heat generated due to an light emission of the light source 6 in a planar direction along the first and second light guiding plates 71, 72, and further the mounting substrate 8 absorbs the heat so as to radiate outward. The mounting substrate 8 is disposed along the first and second light guiding plates 71, 72, thereby a low-profile surface-emitting device can be obtained without damaging the design due to requirement of volume for heat radiation.

In addition, the first and second light guiding plates 71, 72 and the mounting substrate 8 have a heat radiation function, thereby the light source part can be prevented from localization of heat, the first and second light guiding plates 71, 72 can be disposed adjacent to the light source 6, and the light of the light source 6 can enter efficiently. While an acrylic resin based material widely used as the first and second light guiding plates 71, 72 has good light resistance, is low heat resistance so as to easily cause deformation. In addition, not only the problem of heat resistance of the material, but also the problems of a coupling efficiency with the light, propagation efficiency or storage to a case or the like are caused by that if heat is localized, a flexural deformation is caused due to expansion. To the problems, it is an effective action to prevent heat of the light source part from being localized and to expand the heat in a wide range or a whole of the light guiding plate. In addition, while in the first embodiment, the reflecting member is formed of a metal, in the second embodiment, the first and second light guiding plates 71, 72 formed of a resin material are disposed adjacent to the light source 6, thereby they allow the heat to be expanded toward a material having large heat capacity, and to be externally-radiated, although they do not have such a heat conductivity as a metal.

In particular, in case that the sealing material of the LED element 61 is a glass like the embodiment, it has heat conductivity of several w/m/K that is higher by one digital than that of a resin material so as to be easily conduct the heat of the LED element 61, thereby the surface of the glass sealing part 64 has a tendency to be elevated to a high temperature. However, in the embodiment, even though the glass sealing part 64 of the light source 6 and the first and second light guiding plates 71, 72 are disposed adjacent to each other, they are not directly contact with each other via an air layer, accordingly no problem is caused, even if a thermoplastic resin material such as an acrylic resin material easily deformed at 10 degrees C. is used as the first and second light guiding plates 71, 72.

Further, the LED element 61 used in the embodiment is a product that has a heat resistance temperature of 150 degrees C. at the operation, and is used in such a way that electric power is provided in a range of temperature that does not reach the above-mentioned temperature. Namely, if the first and second light guiding plates 71, 72 are only formed of a thermoplastic resin material that has a heat resistance temperature of not less than that of the LED element 61 at the operation, they can be used without any problem.

Further, according to the embodiment, the following effects can be obtained in addition to the effect of heat radiation.

(1) The concave portions 710, 720 in which a part of the light source 6 is respectively housed are formed on the edge surfaces 71a, 72a of the first and second light guiding plates 71, 72, thus processing accuracy of the incidence surface of the light of the light source 6 can be enhanced, in comparison with a case that hole parts in which the light source 6 is housed are formed to be located further interiorly than the edge surfaces 71a, 72a of the first and second light guiding plates 71, 72. This allows the light emitted from the light source 6 to efficiently enter into the inside of the first and second light guiding plates 71, 72. In addition, the concave portions 710, 720 are formed in the edge surfaces 71a, 72a, thereby productivity of the first and second light guiding plates 71, 72 can be enhanced, in comparison with a case that holes for housing the light source in a part other than the edge surface are formed by molding. Namely, in case that holes having a small size for housing the light source in a part other than the edge surface of the light guiding plate are formed by molding, it is needed to use fine pins for the mold, and the pins are easily broken at the mold release, thus productivity is lowered. In particular, if the holes are formed perpendicularly (α=90 degrees C.), both of the upper and lower parts of the light refracted at the inner surface of the hole part 70 become symmetric, and this is the most suitable condition for propagation in the light guiding plate, but on the other hand, it becomes difficult to carry out the mold release. Furthermore, when a plurality of holes are formed in the light guiding plate, forces due to cure shrinkage and the like of the resin material are also applied, thus the pins for forming the holes are more easily broken, and it becomes more difficult to carry out the mold release. In the embodiment, the concave portions 710, 720 are formed on the edge surfaces 71a, 72a of the first and second light guiding plates 71, 72, thereby the above-mentioned problem can be avoided. Further, in not only the case of α=90 degrees C., but also a case of α=less than ±2 degrees or less than ±5 degrees, the above-mentioned problem may be caused to a greater or lesser extend in accordance with the kind or the processing accuracy of the material, or the diameter, the number or the arrangement specification of the pins, but as shown in the embodiment, the light source 6 is housed in the concave portions 710, 720 formed on the edge surfaces 71a, 72a of the first and second light guiding plates 71, 72, thereby the occurrence of the above-mentioned problem can be avoided. Furthermore, the light source 6 is disposed in such a way that the direction in which a plurality of the LED elements 61 are arranged is equalized to the direction along the edge surfaces 71a, 72a, thus the concave portions 710, 720 are not needed to be formed deeply, so that the manufacture of the mold and the shape forming of the first and second light guiding plates 71, 72 by the mold can be easily carried out.

(2) The light exited from the light source 6 enters into the first and second light guiding plates 71, 72 also from a pair of the side surfaces 70b, 70b that intersect with edge surfaces 71a, 72a of the first and second light guiding plates 71, 72, thus it becomes possible to enhance the intensity of radiation light from the first and second light guiding plates 71, 72 in a region between the two light sources 6 neighboring to each other in comparison with a case that the light guiding plate does not have concave portions in the edge surfaces thereof. Due to this, unevenness of distribution of the intensity of the light radiated in a planar shape from the light radiating surfaces 71c, 72c of the first and second light guiding plates 71, 72 can be reduced.

(3) The light source 6 has a configuration that the light emitting layer of the LED element 61 is parallel to the first and second light guiding plates 71, 72, the periphery of the LED element 61 is sealed with the glass sealing part 64 that is translucent, and any reflecting member or the like for guiding the emission light of the LED element 61 in a specific direction is not formed in the light source 6 itself and the periphery thereof. Due to this, it becomes possible to reduce the numbers of components and to realize downsizing. Namely, it is the conventional common sense that the light source is to be coupled with the light guiding plate by using an optical system for narrowing the exit area of the light and the incidence angle range to the light guiding plate. However, in the embodiment, for the purpose of mass production, the light source 6 has a configuration that the LED element 61 is formed to have a shape surrounded by the side surfaces along the center axis thereof, and the optical system for narrowing the exit area of the light is not included. Further, even though a member having a high reflectance is selected as the reflecting frame, the reflecting frame causes an optical loss unless it is a frame in which light absorption is perfectly prevented, thus the light source of the embodiment can also provide an effect that high efficiency and downsizing are achieved. In addition, in the light source of the embodiment, the light that emits from the LED element 61 in a shape surrounded by the side surfaces along the center axis of the LED element 61 so as to reach the side surfaces is refracted in a direction coming close to the central axis direction of the LED element 61. In addition, an amount of light radiated in a direction of a large angle to the central axis of the LED element 61, of the light emitted from the LED element 61 accounts, for example, a large ratio of not less than 50% to the total amount of light, since solid angle in this direction is large, dependent on light distribution characteristics. Namely, the light source becomes a light source of which incidence angle to the light guiding plate is rather expanded. Furthermore, as the glass sealing part 64, a member having a refraction index of not less than 1.6 that is larger than those of a silicon resin (refraction index: approximately 1.4 to 1.5) and an epoxy resin (refraction index: approximately 1.5 to 1.6) can be selected for the purpose of accelerating a light extraction from the LED element 61, thus in this case, the degree of being refracted in a direction coming close to the central axis direction of the LED element 61 becomes larger. In addition, the light that reaches the side surfaces, of the lights emitted from the LED element 61 and excited or scattered at a phosphor, is similarly refracted in a direction coming close to the central axis direction of the LED element 61. Nevertheless, the embodiment has a configuration that the light source is coupled with the light guiding plate in which holes for housing the light source are formed in a direction parallel to the thickness direction thereof, and the light guiding plate is used, the plate having a refractive index that causes a refraction at the time of incidence at the holes for housing that become an incidence surface toward the light guiding plate, and a total reflection at the upper and lower surfaces of the light guiding plate that become a planar direction perpendicular to the incidence surface of the light guiding plate, thereby it becomes possible to couple the light source and the light guiding plate with each other at high efficiency, and reduce the numbers of components and to realize a simplified easy manufacturing.

(4) The light source 6 or the peripheral part does not include an optical member for directing the exit light of the light source 6 toward a specific direction, and the LED element 61 is mounted by a flip-chip bonding, thus it is easily carried out to reduce a distance between the edge surface of the LED element 61 and the side surface 64a of the light source 6 to not more than 1 mm, further not more than 0.5 mm, thereby it becomes possible to decrease the size of the light source 6 in a plan view and to realize the downsizing of the concave portions 710, 720. Due to this, the light source 6 can have a small-sized and not outstanding appearance, even if it is disposed in the central part of the light emitting device 10 instead of the edge part thereof. In addition, it becomes possible to mount the light source 6 of which light axis is directed toward the thickness direction without thickening the first and second light guiding plates 71, 72. On the other hand, for example, in case that the LED element 61 is mounted by a wire bonding connection, space for a wire loop is additionally needed at the outer side of the LED element 61. Furthermore, with regard to the concave portions 710, 720 of the first and second light guiding plates 71, 72, tolerance of mounting or fitting is needed, thus they have a size of not less than five times the LED element 61. Furthermore, an optical surface for controlling the radiating direction to be directed toward the side surface direction, it is needed for concave portions 710, 720 of the first and second light guiding plates 71, 72 to have a size of not less than twelve times the LED element 61. For example, if the inorganic material substrate 62 has a size of a square of 2.5 mm on a side, it is needed for the hole parts 70 of the first and second light guiding plates 71, 72 to have a size enlarged such as a square of 3.0 mm on a side. In addition, if the light emitting device 10 is manufactured to have the above-mentioned size, the ratio of solid angle of inner surface of the hole part 70 based on the central part of the upper surface 64b of the light source 6 is reduced by 35%, even though the same LED element 61 is mounted. Also, if the height of the light source 6 is not changed, but the size thereof in a plan view is decreased, the light distribution in a transverse direction is relatively increased. Further, in case that phosphor is dispersed in the sealing material, if the size in the planar direction becomes smaller than the height of the sealing material, a difference of chromaticity of the light between the upper direction and the transverse direction is likely to become pronounced, but even if the difference of the chromaticity is caused, it can be eliminated by a light mixing in the first and second light guiding plates 71, 72. In addition, the heat radiation pattern 66 and the circuit pattern 63 of the light source 6 are formed in a surface at the side of the mounting substrate 8 of the inorganic material substrate 62, thus at the time of mounting on the mounting substrate 8 by using an eutectic material such as solder, it is possible to inhibit the solder from protruding or to suppress the protrusion in an extremely slight amount, in comparison with a case that the circuit pattern is formed in the side surface of the inorganic material substrate 62, thereby it becomes possible to lessen the holes of the first and second light guiding plates 71, 72 to a size that is closer to the size of the light source 6. Due to this, it is possible to enhance a light coupling efficiency from the light source 6 to the first and second light guiding plates 71, 72. In addition, it is possible to adopt a hole position accuracy with a large margin of the first and second light guiding plates 71, 72 to the light source 6, and to improve the production yield.

(5) Since it is not necessary to apply an optical processing to the upper surface 64b and the side surface 64a of the light source 6, it is possible to manufacture the light source 6 simply and easily. In case of the light emitting device 10, it is rather preferred to adopt the light source 6 having a light distribution that the maximum light intensity does not exist on the light axis, and it is only necessary to form the concave portions 710, 720 having a simple shape without applying a process to the light source 6 having a cubic shape, thus it is extremely advantageous at the time of practical use.

In addition, the light source 6 has a small size without including an optical system, thus it is possible to arrange a great number of light sources 6 compactly so as to be have a high intensity. On the other hand, also in case that the light sources 6 are arranged in such a way that the distance between the respective light sources 6 is relatively broadened, the light is radiated in a 360 degrees radius of a planar direction perpendicular to the central axis of the light source 6, thus it is possible to prevent the decrease in intensity between the respective light sources 6.

In addition, the first and second light guiding plates 71, 72 can be laminated with each other by a transparent optical adhesive or the like, but voids are microscopically maintained between the edge surfaces without trying to laminate them, thereby it is possible to prevent the light guiding plate from being expanded so as to have a stress and cause a deflection by heat generated from the light source and the like. In addition, the embodiment shows a configuration that the light source 6 are surrounded by the two light guiding plates, it is also possible to adopt a configuration that the light source 6 are surrounded by the three or four light guiding plates, or the further larger number of light guiding plates.

Further, not only a device having a configuration that the light sources are arranged in a space sandwiched between a pair of the light guiding plates, but also a device having a configuration that through holes or concave portions are formed in a piece of light guiding plate so as to arrange the light sources can provide the same operation and effect.

Modification 1 of the Second Embodiment

The above-mentioned second embodiment can be modified as explained below. Namely, the light emitting device 10 according to the second embodiment has a configuration that a pair of the first and second light guiding plates 71, 72 are included and a plurality of the light sources 6 are disposed in a linear shape between the pair of the first and second light guiding plates 71, 72, a light emitting device having a configuration that a single light guiding plate is included and a plurality of the light sources 6 are disposed in concave portions formed on the peripheral part thereof can be also adopted.

FIG. 14A is a plan view schematically showing a light emitting device 11 according to a first modification of the second embodiment, FIG. 14B is a cross-sectional view taken along the line E-E in FIG. 14A. FIG. 14C is a partially enlarged plan view of "F" part shown in FIG. 14A.

The light emitting device 11 includes a case 91, a single light guiding plate 73 that is housed in the case 91, a plurality of the light source 6 that are respectively housed in a plurality of concave portions 730 formed in the light guiding plate 73, and the mounting substrate 8 on which a plurality of the light sources 6 are mounted. The light source 6 is configured similarly to the light source 6 explained referring to FIG. 12.

The case 91 is a high heat conduction material formed of an aluminum alloy having a heat conductivity of not less than 100 W/m·K, and includes a bottom part 910 and side wall parts 911 that is formed to extend in a direction perpendicular to the bottom part 910.

The light guiding plate 73 is formed to have a rectangular shape on a plan view, and in both edge surfaces 73a that corresponds to a short side of the rectangular shape, a plurality of the concave portions 730 that passes through the light guiding plate 73 in the thickness direction are formed. The edge surfaces 73a of the light guiding plate 73 are opposite to the side wall parts 911 of the case 91. The light sources 6 have a configuration that the peripheral part thereof in a direction parallel to the mounting substrate 8 is surrounded by the inner surfaces of the concave portions 730 of the light guiding plate 73 and the side wall parts 911 of the case 91.

In addition, as shown in FIG. 14B, the light guiding plate 73 has a configuration that one surface thereof at the side of the bottom surface 910 of the case 91 is formed as a heat absorbing surface 73b for facing the mounting substrate 8 and absorbing the heat of the light source 6, and another surface thereof that does not face the mounting substrate 8 is formed as a light radiating surface 73c for radiating outward the light of the light source 6 entered from the inner surfaces of the concave portions 730. The light radiating surface 73c also functions as a heat radiating surface for radiating outward the heat conducted through the light guiding plate 73 in the thickness direction after absorbed from the heat absorbing surface 73b.

FIG. 14C shows shapes of the heat radiation conductor pattern 81 and the wiring conductor pattern 82 formed on the mounting substrate 8. The mounting substrate 8 is a flexible substrate that includes the heat radiation conductor pattern 81 and the wiring conductor pattern 82 formed of a copper material having a layer-like shape of 70 μm thickness, and insulating materials 80 formed of polyimide or a liquid crystal polymer material that sandwich the conductor patterns 81, 82 from both surfaces.

FIG. 14C shows parts of the heat radiation conductor pattern 81 and the wiring conductor pattern 82 that are formed on the surface of the mounting substrate 8 at the side of the light guiding plate 73 so as to be covered with the insulating materials 80 by broken lines, and boundaries of parts of the heat radiation conductor pattern 81 and the wiring conductor pattern 82 that are exposed from the insulating materials 80 by solid lines respectively, and further shows outlines of the light source 6 and the light guiding plate 73 located at the upper side of the mounting substrate 8 by chain double-dashed lines.

The heat radiation conductor pattern 81 includes a bonding part 81a that includes a region exposed from the insulating materials 80 so as to be bonded to the heat radiation pattern 66 (refer to FIG. 12) of the light source 6, and an extending part 81b that is formed at one side (at the side of the light guiding plate 73) of the bonding part 81a so as to extend in a direction perpendicular to the longitudinal direction of the light source 6.

The bonding part 81a of the heat radiation conductor pattern 81 is formed to have almost the same width as the width in the longitudinal direction of the heat radiation pattern 66, and to reach the extending part 81b from the bonding part to the heat radiation pattern 66. In the example shown in FIG. 14C, the width in the longitudinal direction of the heat radiation pattern 66 is substantively equal to the width of the bonding part 81a, but the width of the bonding part 81a can be wider than the width in the longitudinal direction of the heat radiation pattern 66.

The extending part 81b has a rectangular shape of which long side corresponds to the longitudinal direction of the light source 6. In particular, the extending part 81b has a rectangular shape which is composed of the long side having a length not less than the long side width of the light source 6, and the short side having a length determined in such a way that the area of the heat radiation conductor pattern 81 is not less than two times, preferably not less than five times or not less than ten times the bottom area of the light source 6. A part of the extending part 81b via the insulating layer 80 faces the heat absorbing surface 73b of the light guiding plate 73. The heat absorbing surface 73b of the light guiding plate 73 faces the surface of the insulating layer 80 at the upper side of the extending part 81b.

The inner surface of the concave portion 730 includes a bottom surface 730a that is parallel to the edge surface 73a, a pair of side surfaces 730b, 730b that is formed in a direction perpendicular to the edge surface 73a so as to face each other, and two are surfaces 730c that are formed respectively between the bottom surface 730a and the side surfaces 730b. The inner surface of the concave portion 730 is an incidence surface from which the light of the light source 6 enters into the inside of the light guiding plate 73. The concave portion 730 is formed to have a size that is capable of housing a whole of the light source 6 therein.

In addition, the side wall part 911 of the case 91 facing the bottom surface 730a of the concave portions 730 functions as a reflecting part for reflecting the light of the light source 6 toward the inner surface of the concave portions 730.

According to the above-mentioned configuration, while it is a structure for preventing the structure from being complicated such as through holes being formed in the mounting substrate 8, it has a structure that the heat radiation conductor pattern 81 of the mounting substrate 8 is formed to have an area of not less than several times or ten times the heat radiation pattern of the light source 6, thereby heat generated by power distribution to the light source 6 is diffused through the heat radiation pattern 66, the bonding part 81a of the heat radiation conductor pattern 81, and the extending part 81b of the heat radiation conductor pattern 81 to a wide area. In addition, the heat is diffused in the wide area, thus it is possible to reduce the influence of heat resistance of the insulating layer 80 to several times less or ten times less, and to conduct the heat to the light guiding plate 73. Further, the heat radiation conductor pattern 81 is broadened to a region in which the light guiding plate 73 is formed, thus the heat is conducted from the heat absorbing surface 73b of the light guiding plate 73 to the light guiding plate 73, and further is conducted through the light guiding plate 73 in the thickness direction thereof so as to be radiated from the light radiating surface 73c. On the other hand, this is due to the fact that the light guiding plate 73 is disposed adjacent to the light source 6. Further, in FIGS. 14A to 14C, the light source 6 has a small size, thus it appears that both are far away from each other, but the heat radiation conductor pattern is a copper material having a layer-like shape of 70 μm thickness, and, the light guiding plate 73 is located at the distance that is ten times to twenty times the thickness, thus both are disposed at locations in which the heat can be easily conducted.

In addition, the light guiding plate 73 receives light of light source 6 through the inner surface of the concave portion 730 and radiates light in a planar shape from the light radiating surface 73c. At the side of the short side of the light guiding plate 73, the light source 6 in which a plurality of the LED elements 61 are arranged in a row has a configuration that the short side direction of the light guiding plate 73 corresponds to the arrangement direction of the LED elements 61, thus it is possible to increase the light intensity toward the long side direction of the light guiding plate 73. Namely, a direction perpendicular to the long side direction of the light source 6 corresponds to the long side direction of the light guiding plate 73, thus it is possible to increase the light intensity radiated from the plural LED elements 61 in the long side direction of the light guiding plate 73, and simultaneously the light radiated and reflected in a direction of the side wall part 911 of the long side direction of the light guiding plate 73 is likely to travel in the short side direction of the light source 6, so as to be easily reflected to the side of the light guiding plate 73. Further, depending on applications, a configuration that at the side of the long side of the light guiding plate 73, the long side direction of the light guiding plate 73 corresponds to the arrangement direction of the LED elements 61 can be also adopted. Furthermore, a configuration that the light source 6 is disposed at both sides of the long side and the short side of the light guiding plate 73 can be also adopted.

As mentioned above, the light guiding plate 73 guides the point-like shaped light of the light source 6 in a predetermined direction, and diffuses the light, thereby allows the light to have a planar shape, and simultaneously, the mounting substrate 8 widely diffuses the heat generated by the light emission of the light source 6 in the planar direction along the light guiding direction, and further the heat is absorbed from the mounting substrate 8 so as to be radiated outward. Accordingly, the light source 6 and the light guiding plate 73 are disposed adjacent to each other, thereby it is possible to make the light of the light source 6 enter into the light guiding plate 73 efficiently.

Further, a flexible substrate is used as the mounting substrate 8, thereby the light guiding plate 73 can be formed of, for example, a partial shape of a curved surface of a columnar shape that has an axis direction parallel to the arrangement direction of the light source 6, instead of a planar shape. In this case, the light emitting device can be used as a low-profile light emitting device for being mounted on a surface of a column having a cylindrical shape. In addition, heat conduction from the mounting substrate 8 to the light guiding plate 73 can be also carried out.

Modification 2 of the Second Embodiment

Figure 15A:
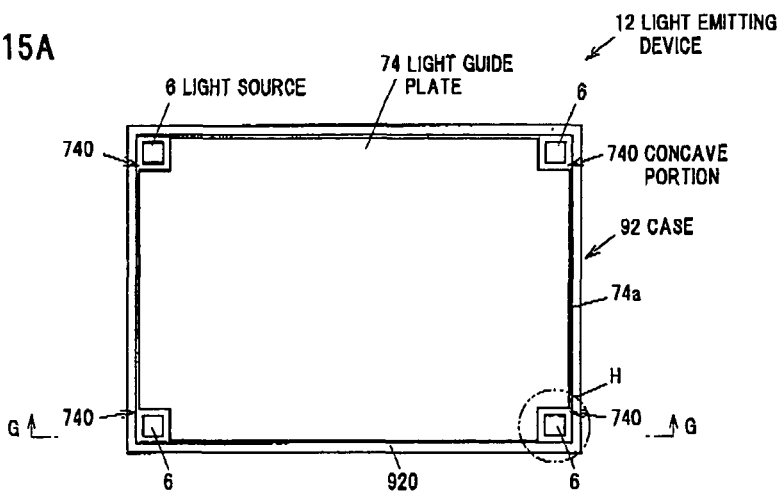
FIG. 15A is a plan view schematically showing a light emitting device according to a second modification of the second embodiment.
Figure 15B:
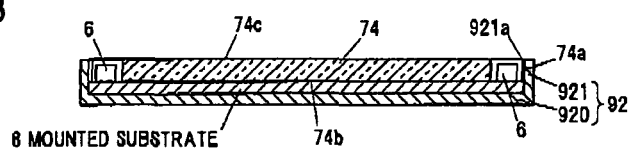
FIG. 15B is a cross-sectional view taken along the line G-G in FIG. 15A.
Figure 15C:
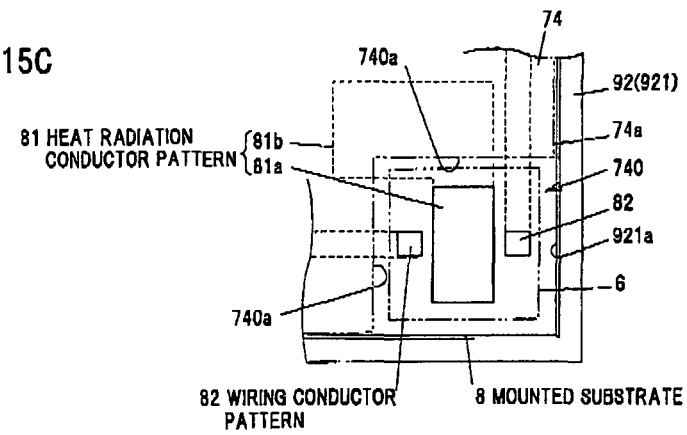
FIG. 15C is a partially enlarged plan view of "H" part shown in FIG. 15A.

FIG. 15A is a plan view schematically showing a light emitting device 12 according to a second modification of the second embodiment, FIG. 15B is a cross-sectional view taken along the line G-G in FIG. 15A, and FIG. 15C is a partially enlarged plan view of "H" part shown in FIG. 15A.

The light emitting device 12 includes a case 92, a single light guiding plate 74 having a rectangular shape housed in the case 92, four light sources 6 respectively housed in four concave portions 740 formed at the four corners of the light guiding plate 74, and the mounting substrate 8 on which the light sources 6 are mounted. The light source 6 has the same configuration as the light source explained referring to FIG. 12 except for being formed to have a square shape in a plan view.

The case 92 includes a bottom part 920 and a side wall part 921 formed to extend in a direction perpendicular to the bottom part 920.

The light guiding plate 74 is formed to have a rectangular shape in a plan view, at the four corners of the light guiding plate 74, the four concave portions 740 are formed to be cut out. The concave portions 740 pass through the light guiding plate 74 in the thickness direction, and house the light sources 6 therein. An edge surface 74a of the light guiding plate 74 faces the side wall part 921 of the case 92.

In addition, as shown in FIG. 15B, the light guiding plate 74 has a configuration that one surface thereof at the side of the bottom surface 920 of the case 92 is formed as a heat absorbing surface 74b for facing the mounting substrate 8 and absorbing the heat of the light source 6, and another surface thereof that does not face the mounting substrate 8 is formed as a light radiating surface 74c for radiating outward the light of the light source 6 entered from the inner surfaces of the concave portions 740. The light radiating surface 74c also functions as a heat radiating surface for radiating outward the heat of the light source 6 conducted from the heat absorbing surface 74b.

FIG. 15C shows shapes of the heat radiation conductor pattern 81 and the wiring conductor pattern 82 formed on the insulating layer of the mounting substrate 8. FIG. 15C shows parts of the heat radiation conductor pattern 81 and the wiring conductor pattern 82 that are covered with the white resist layer 83 formed on the outermost surface of the mounting substrate 8 by broken lines, and parts of the heat radiation conductor pattern 81 and the wiring conductor pattern 82 that are exposed from the white resist layer 83 by solid lines respectively, and further shows outlines of the light source 6 and the light guiding plate 74 located at the upper side of the mounting substrate 8 by chain double-dashed lines.

The heat radiation conductor pattern 81 includes a bonding part 81a that includes a region exposed from the white resist layer 83 so as to be bonded to the heat radiation pattern 66 (refer to FIG. 12) of the light source 6, and an extending part 81b that is formed to extend toward the side of the light guiding plate 74 from the bonding part 81a.

The bonding part 81a of the heat radiation conductor pattern 81 is formed to have almost the same width as the width of the exposed part of the bonding part 81a in the connection direction (transverse direction in FIG. 15C) of the two exposed parts of the wiring conductor pattern 82, and to reach the extending part 81b from the bonding part to the heat radiation pattern 66.

The extending part 81b has a rectangular shape in a plan view, and a part thereof faces the heat absorbing surface 74b of the light guiding plate 74 via the white resist layer 83. The heat absorbing surface 74b of the light guiding plate 74 is contact with the surface of the white resist layer 83 in the upper side of the extending part 81b.

The inner surface of the concave portion 740 includes side surfaces 740a, 740a respectively parallel to edge surfaces 74a perpendicular to each other. The inner surface of the concave portion 740 is an incidence surface from which the light of the light source 6 enters into the inside of the light guiding plate 74. In addition, the inner surface 921a of the side wall part 921 facing the side surfaces 740a, 740a of the concave portion 740 functions as a reflecting surface that reflects the light of the light source 6 toward the inner surface of the concave portion 740.

The concave portions 740 are respectively formed in such a size that the light source 6 can be housed within the range of the light guiding plate 74 in the case that the light guiding plate 74 has a rectangular shape without cutout. In addition, 360 degrees around the central axis of the light source 6 are surrounded optical surfaces, the half constitutes an incidence surface of the light guiding plate 74, and the remaining half constitutes the inner surface 921a that is a reflecting surface of the side wall part 921, thus an optical efficiency can be enhanced.

According to the above-mentioned configuration, while it is a structure for preventing the structure from being complicated such as through holes being formed in the mounting substrate 8, it has a structure that the heat radiation conductor pattern 81 of the mounting substrate 8 is formed to have an area of not less than several times or ten times the heat radiation pattern of the light source 6, thereby heat generated by power distribution to the light source 6 is diffused through the heat radiation pattern 66, the bonding part 81a of the heat radiation conductor pattern 81, and the extending part 81b of the heat radiation conductor pattern 81 to a wide area.

In addition, the heat is diffused in the wide area, thus it is possible to reduce the influence of heat resistance of the insulating layer 80 to several times less or ten times less, and to conduct the heat to the light guiding plate 74. Further, the heat radiation conductor pattern 81 is broadened to a region in which the light guiding plate 74 is formed, thus the heat is conducted from the heat absorbing surface 74b of the light guiding plate 74 to the light guiding plate 74 via the insulating layer 80, and furthermore the heat is conducted through the light guiding plate 74 in the thickness direction thereof so as to be radiated outward from the light radiating surface 74c. In addition, the light guiding plate 74 receives light of the light source 6 through the inner surface of the concave portion 740 so as to radiate the light in a planar shape from the light radiating surface 74c.

Namely, the light guiding plate 74 guides the point-like shaped light of the light source 6 in a predetermined direction and diffuses the light, so as to form a planar light, and simultaneously the mounting substrate 8 widely diffuses heat generated due to an light emission of the light source 6 in a planar direction along the light guiding direction and further the mounting substrate 8 absorbs the heat so as to radiate outward. Accordingly, the light source 6 and the light guiding plate 74 are disposed adjacent to each other, thereby it is possible to make the light of the light source 6 enter into the light guiding plate 74 efficiently.

Other Embodiments

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

For example, in the embodiment shown in FIG. 11, a configuration that a plurality of reflecting surfaces having a circular shape are formed on the heat absorbing surfaces 71b, 72b of the first and second light guiding plates 71, 72, the light in the first and second light guiding plates 71, 72 is reflected by the reflecting surfaces, so as to be extracted from the light radiating surfaces 71c, 72c can be also adopted. In this case, it is preferable that the area of the reflecting surface is configured in such a way that the more it is distanced from the edge surfaces 71a, 72a, the more it is enlarged. This makes it possible to homogenize distribution of the radiation light in the light radiating surfaces 71e, 72c. Further, the reflecting surface can be formed by screen printing, ink-jet printing, laser processing, thermal transfer using a mold or the like. In particular, in case of the ink-jet printing, the laser processing or the like, blocks used in the screen printing or the like are not needed, for example, processing of the reflecting surface can be carried out in accordance with the light emitting characteristic of the light emitting device actually manufactured. Furthermore, in case of the ink-jet printing, nozzles are thoroughly disposed above the first and second light guiding plates 71, 72, thereby a wide range of processing can be carried out at the same time, so that it has an advantage that it has an excellent workability.

What is claimed is:

1. A light emitting device, comprising:
    a light source comprising an inorganic material substrate, a light emitting element mounted on a mounting surface of the inorganic material substrate, and a circuit metalized pattern and a heat radiation metalized pattern formed on a non-mounting surface of the inorganic material substrate on which the light emitting element is not mounted;
    a mounting substrate comprising a mounting surface on which the light source is mounted, a current providing conductor pattern bonded to the circuit metallized pattern and a heat radiation conductor pattern bonded to the heat radiation metalized pattern, the current providing conductor pattern and the heat radiation conductor pattern being formed on the mounting surface on the mounting substrate; and
    an optical member disposed on the mounting surface of the mounting substrate so as to guide a light emitted from the light source in a predetermined direction,
    wherein the optical member comprises a heat absorbing surface at least a part of which faces the heat radiation conductor pattern of the mounting substrate, and a heat radiating surface that radiates heat of the light source conducted from the heat radiation conductor pattern via the heat absorbing surface,
    wherein the mounting substrate further comprises an insulating layer on the mounting surface,
    wherein the heat radiation conductor pattern is formed on the insulating layer, and
    wherein the heat radiation conductor pattern has an area not less than twice an area of the heat radiation metalized pattern.

2. The light emitting device according to claim 1, wherein the heat radiation metalized pattern is formed including at least a part of a region of the side of the non-mounting surface corresponding to a mounting region in the mounting surface in which the light emitting element is mounted.

3. The light emitting device according to claim 1, wherein the heat radiation metalized pattern is formed between a pair of electrodes for providing electric power to the light emitting element formed on the inorganic material substrate and insulated from the pair of electrodes.

4. The light emitting device according to claim 3, wherein the heat radiation conductor pattern has a width corresponding to a width of the heat radiation metalized pattern in a direction of connecting the pair of electrodes and extends from a bonding part thereof to the heat radiation metalized pattern to a position opposite to the heat absorbing surface of the optical member.

5. The light emitting device according to claim 1, wherein the optical member further comprises a reflecting surface opposite to the light source for reflecting light of the light source.

6. The light emitting device according to claim 5, wherein the optical member further comprises:
    a main body part comprising a metal material; and
    a reflecting part comprising a white resin material and formed opposite to the light source, and the reflecting surface is on a surface of the reflecting part opposite to the light source.

7. The light emitting device according to claim 1, wherein the optical member comprises a translucent material and plate-shaped so as to guide light of the light source inputted through an end surface thereof to be outputted from an other surface thereof.

8. The light emitting device according to claim 1, further comprising a plurality of optical members disposed parallel in such a way that edge surfaces themselves face each other across a space formed there between.

9. The light emitting device according to claim 1, wherein a height of the optical member from the mounting substrate is the same as a height of the light source from the mounting substrate.

10. The light emitting device according to claim 1, wherein an outer surface of the light source and the heat radiating surface are coplanar.

11. The light emitting device according to claim 1, wherein the optical member further comprises a reflecting surface perpendicular to the heat radiating surface for reflecting light of the light source.

12. The light emitting device according to claim 1, wherein the optical member further comprises a reflecting surface directly facing a side surface of the light source for reflecting light of the light source.

13. The light emitting device according to claim 1, wherein a central part of the heat radiation conductor pattern is disposed at a lower side of the light source.

14. The light emitting device according to claim 13, wherein the heat radiation conductor pattern further comprises an extending part which faces the heat absorbing surface.

15. The light emitting device according to claim 1, wherein the heat absorbing surface and the heat radiating surface of the optical member are parallel to the mounting surface of the mounting substrate.

16. The light emitting device according to claim 1, wherein the heat radiation conductor pattern includes a central part, a first extending part extending from the central part in a first direction perpendicular to an arrangement direction of the light source, and a second extending part extending from the central part in a second direction perpendicular to the arrangement direction of the light source, and
    wherein a width of the central part is less than a width of the first extending part and the second extending part.

17. The light emitting device according to claim 16, wherein, each of the first extending part and the second extending part has an area not less than twice an area of the heat radiation conductor pattern.

18. The light emitting device according to claim 16, wherein the current providing conductor pattern extends to a region between the first extending part and the second extending part.

19. The light emitting device according to claim 16, wherein the current providing conductor pattern extends to a region near an edge of the central part of the heat radiation conductor pattern.

\* \* \* \* \*